United States Patent
Feng et al.

(10) Patent No.: US 11,798,486 B2
(45) Date of Patent: Oct. 24, 2023

(54) SHIFT REGISTER, GATE DRIVE CIRCUIT AND DRIVING METHOD THEREFOR

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/764,209

(22) PCT Filed: May 20, 2021

(86) PCT No.: PCT/CN2021/094949
§ 371 (c)(1),
(2) Date: Mar. 28, 2022

(87) PCT Pub. No.: WO2021/254087
PCT Pub. Date: Dec. 23, 2021

(65) Prior Publication Data
US 2022/0343858 A1    Oct. 27, 2022

(30) Foreign Application Priority Data
Jun. 19, 2020 (CN) .......................... 202010567364.3

(51) Int. Cl.
*G09G 3/3266* (2016.01)
*G09G 3/3225* (2016.01)

(52) U.S. Cl.
CPC ......... *G09G 3/3266* (2013.01); *G09G 3/3225* (2013.01); *G09G 2300/0426* (2013.01);
(Continued)

(58) Field of Classification Search
CPC .............. G09G 3/3266; G09G 3/3225; G09G 2300/0426; G09G 2310/0286;
(Continued)

(56) References Cited

U.S. PATENT DOCUMENTS

2009/0109247 A1   4/2009   Kimura
2010/0177089 A1   7/2010   Huang
(Continued)

FOREIGN PATENT DOCUMENTS

CN   101420519 A   4/2009
CN   102117659 A   7/2011
(Continued)

OTHER PUBLICATIONS

International Search Report for PCT/CN2021/094949 dated Aug. 5, 2021.
(Continued)

*Primary Examiner* — Dennis P Joseph
(74) *Attorney, Agent, or Firm* — Ling Wu; Stephen Yang; Ling and Yang Intellectual Property

(57) ABSTRACT

A shift register, a gate drive circuit and a driving method therefor. The shift register includes a display pre-charge reset subcircuit, a sensing pre-charge reset subcircuit, a pull-down control subcircuit, an output subcircuit, a sensing cascade subcircuit and a black frame insertion cascade subcircuit. The display pre-charge reset subcircuit is configured to provide a signal of a first power supply end for a pull-up node under control of a first signal input end and provide a signal of a second power supply end to the pull-up node under control of a reset signal end; the sensing pre-charge reset subcircuit is configured to provide a signal of a first clock signal end to the pull-up node under control of the sensing cascade node and the first clock signal end, and
(Continued)

provide a signal of the second power supply end to the pull-up node under control of a total reset end.

20 Claims, 14 Drawing Sheets

(52) U.S. Cl.
CPC ........... *G09G 2300/0842* (2013.01); *G09G 2310/0286* (2013.01); *G09G 2310/08* (2013.01); *G09G 2320/029* (2013.01); *G09G 2320/0233* (2013.01); *G09G 2320/0252* (2013.01); *G09G 2320/0257* (2013.01); *G09G 2330/021* (2013.01)

(58) Field of Classification Search
CPC ....... G09G 2310/08; G09G 2320/0233; G09G 2320/0252; G09G 2320/0257; G09G 2320/029
See application file for complete search history.

(56) References Cited

U.S. PATENT DOCUMENTS

| | | |
|---|---|---|
| 2011/0157124 A1 | 6/2011 | Jung et al. |
| 2014/0118052 A1 | 5/2014 | Liu et al. |
| 2018/0337682 A1* | 11/2018 | Takasugi ............... H03K 21/18 |
| 2019/0096313 A1* | 3/2019 | Zhang .................... G09G 3/20 |
| 2019/0096500 A1* | 3/2019 | Gu ......................... G09G 3/20 |
| 2019/0206294 A1* | 7/2019 | Tian ....................... G11C 19/28 |
| 2020/0066211 A1 | 2/2020 | Lee et al. |
| 2020/0118509 A1 | 4/2020 | Noh et al. |
| 2020/0168162 A1* | 5/2020 | Feng ................... G09G 3/3266 |
| 2020/0184899 A1 | 6/2020 | Lee et al. |
| 2021/0065630 A1 | 3/2021 | Feng et al. |
| 2021/0201803 A1 | 7/2021 | Feng et al. |
| 2021/0335197 A1 | 10/2021 | Feng et al. |
| 2021/0335266 A1 | 10/2021 | Feng et al. |
| 2021/0375211 A1 | 12/2021 | Feng et al. |
| 2022/0005400 A1 | 1/2022 | Feng et al. |

FOREIGN PATENT DOCUMENTS

| | | |
|---|---|---|
| CN | 103150987 A | 6/2013 |
| CN | 108806597 A | 11/2018 |
| CN | 109920379 A | 6/2019 |
| CN | 109935196 A | 6/2019 |
| CN | 109935198 A | 6/2019 |
| CN | 109935209 A | 6/2019 |
| CN | 109949749 A | 6/2019 |
| CN | 110136653 A | 8/2019 |
| CN | 110853583 A | 2/2020 |
| CN | 111599315 A | 8/2020 |
| KR | 10-2013-0115908 A | 10/2013 |
| KR | 10-2018-0098193 A | 9/2018 |
| KR | 10-2019-0074813 A | 6/2019 |
| KR | 10-2020-0041605 A | 4/2020 |
| KR | 10-2020-0061121 A | 6/2020 |

OTHER PUBLICATIONS

Office Action dated Mar. 3, 2021 for Chinese Patent Application No. 202010567364.3 and English Translation.

* cited by examiner under control of the pull-up node, and provide the signal of the second power supply terminal to the cascade output terminal and provide a signal of a reset power supply terminal to the one or more signal output terminals under the control of the pull-down node; the sensing cascade sub-circuit is configured to provide a signal of the first signal input terminal to the sensing cascade node under control of a first random signal terminal; and the black frame insertion cascade sub-circuit is configured to provide a signal of a second signal input terminal to the sensing cascade node under control of a second random signal terminal.

SHIFT REGISTER, GATE DRIVE CIRCUIT AND DRIVING METHOD THEREFOR

CROSS-REFERENCE TO RELATED APPLICATIONS

The present application is a U.S. National Phase Entry of International Application PCT/CN2021/094949 having an international filing date of May 20, 2021, which claims priority of Chinese Patent Application No. 202010567364.3, entitled "Shift Register, Gate Drive Circuit and Driving Method Therefor", filed to the CNIPA on Jun. 19, 2020, the contents disclosed in the above-mentioned applications are hereby incorporated as a part of this application.

TECHNICAL FIELD

Embodiments of the present disclosure relate to, but are not limited to, the field of display technology, in particular to a shift register, a gate drive circuit, a method for driving the shift register.

BACKGROUND

With continuous development of science and technology, a variety of display devices emerge one after another, which brings great convenience to people's production and life.

In a display process of a display panel, especially an Organic Light Emitting Diode (OLED) display panel, a phenomenon of image smearing will occur when a dynamic picture is switched, that is, when the display panel is switched from one frame to another frame, the user will feel the image smearing of a previous frame (also referred to as dynamic image smearing), thus affecting display effects.

SUMMARY

The following is a summary of subject matters described in detail herein. The summary is not intended to limit the scope of protection of claims.

An embodiment of the present disclosure provides a shift register, including a display pre-charge reset sub-circuit, a sensing pre-charge reset sub-circuit, a pull-down control sub-circuit, an output sub-circuit, a sensing cascade sub-circuit and a black frame insertion cascade sub-circuit, wherein the display pre-charge reset sub-circuit is configured to provide a signal of a first power supply terminal to a pull-up node under control of a first signal input terminal, and provide a signal of a second power supply terminal to the pull-up node under the control of a reset signal terminal; the sensing pre-charge reset sub-circuit is configured to provide a signal of a first clock signal terminal to the pull-up node under control of a sensing cascade node and the first clock signal terminal, and provide a signal of the second power supply terminal to the pull-up node under control of a total reset terminal; the pull-down control sub-circuit is configured to provide the signal of the first power supply terminal or the second power supply terminal to a pull-down node under the control of the pull-up node; the output sub-circuit is configured to provide a signal of a second clock signal terminal to a cascade output terminal and provide signals of corresponding driving clock signal terminals to one or more signal output terminals under the control of the pull-up node, and provide the signal of the second power supply terminal to the cascade output terminal and provide a signal of a reset power supply terminal to the one or more signal output terminals under the control of the In some possible implementations, the black frame insertion cascade sub-circuit includes a first transistor, wherein a control electrode of the first transistor is connected with the second random signal terminal, a first electrode of the first transistor is connected with the second signal input terminal, and a second electrode of the first transistor is connected with the sensing cascade node.

In some possible implementations, the sensing cascade sub-circuit includes a second transistor, wherein a control electrode of the second transistor is connected with the first random signal terminal, a first electrode of the second transistor is connected with the first signal input terminal, and a second electrode of the second transistor is connected with the sensing cascade node.

In some possible implementations, the sensing pre-charge reset sub-circuit includes a third transistor, a fourth transistor and a fifth transistor, wherein a control electrode of the third transistor is connected with the sensing cascade node, a first electrode of the third transistor is connected with the first clock signal terminal, and a second electrode of the third transistor is connected with a sensing pre-charge node; a control electrode of the fourth transistor is connected with the first clock signal terminal, a first electrode of the fourth transistor is connected with the sensing pre-charge node, and a second electrode of the fourth transistor is connected with the pull-up node; and a control electrode of the fifth transistor is connected with the total reset terminal, a first electrode of the fifth transistor is connected with the pull-up node, and a second electrode of the fifth transistor is connected with the second power supply terminal.

In some possible implementations, the display pre-charge reset sub-circuit includes a sixth transistor and a seventh transistor, wherein a control electrode of the sixth transistor is connected with the first signal input terminal, a first electrode of the sixth transistor is connected with the first power supply terminal, and a second electrode of the sixth transistor is connected with the pull-up node; and a control electrode of the seventh transistor is connected with the reset signal terminal, a first electrode of the seventh transistor is connected with the pull-up node, and a second electrode of the seventh transistor is connected with the second power supply terminal.

In some possible implementations, the pull-down control sub-circuit includes an eighth transistor and a ninth transistor, wherein a control electrode and a first electrode of the eighth transistor are both connected with the first power supply terminal, and a second electrode of the eighth transistor is connected with the pull-down node; a control electrode of the ninth transistor is connected with the pull-up node, a first electrode of the ninth transistor is connected with the pull-down node, and a second electrode of the ninth transistor is connected with the second power supply terminal.

In some possible implementations, the output sub-circuit includes a tenth transistor, an eleventh transistor, a twelfth transistor, a thirteenth transistor, a fourteenth transistor and a fifteenth transistor, wherein a control electrode of the tenth transistor is connected with the pull-up node, a first electrode of the tenth transistor is connected with the second clock signal terminal, and a second electrode of the tenth transistor is connected with the cascade output terminal; a control electrode of the eleventh transistor is connected with the pull-down node, a first electrode of the eleventh transistor is connected with the cascade output terminal, and a second electrode of the eleventh transistor is connected with the second power supply terminal; a control electrode of the twelfth transistor is connected with the pull-up node, a first electrode of the twelfth transistor is connected with a first driving clock signal terminal, and a second electrode of the twelfth transistor is connected with a first signal output terminal; a control electrode of the thirteenth transistor is connected with the pull-down node, a first electrode of the thirteenth transistor is connected with the first signal output terminal, and a second electrode of the thirteenth transistor is connected with the reset power supply terminal; a control electrode of the fourteenth transistor is connected with the pull-up node, a first electrode of the fourteenth transistor is connected with a second driving clock signal terminal, and a second electrode of the fourteenth transistor is connected with a second signal output terminal; and a control electrode of the fifteenth transistor is connected with the pull-down node, a first electrode of the fifteenth transistor is connected with the second signal output terminal, and a second electrode of the fifteenth transistor is connected with the reset power supply terminal.

In some possible implementations, the first signal output terminal is connected with a first gate line in a pixel circuit, and the second signal output terminal is connected with a second gate line in the pixel circuit.

In some possible implementations, the shift register further includes a noise reduction sub-circuit, wherein the noise reduction sub-circuit is configured to provide the signal of the second power supply terminal to the pull-up node under the control of the pull-down node.

In some possible implementations, the noise reduction sub-circuit includes a sixteenth transistor, wherein a control electrode of the sixteenth transistor is connected with the pull-down node, a first electrode of the sixteenth transistor is connected with the pull-up node, and a second electrode of the sixteenth transistor is connected with the second power supply terminal.

An embodiment of the present disclosure further provides a gate drive circuit, including multiple cascaded shift registers as described above; first signal input terminals of shift registers located at first and second stages are connected with a frame start signal input terminal, a first signal input terminal of a shift register located at an i-th stage is connected with a cascade output terminal of a shift register located at a (i−2)-th stage, wherein 3≤i≤N, and N is a total quantity of stages of the shift registers; second signal input terminals of shift registers located at first to sixth stages are connected with a black frame insertion start signal input terminal, and second signal input terminals of shift registers located at (6m+1)-th to (6m+6)-th stages are connected with a cascade output terminal of a shift register located at a (6m)-th stage, wherein m is a positive integer; reset signal terminals of shift registers located at (N−4)-th to N-th stages are connected with a reset signal line, and a reset signal terminal of a shift register located at a k-th stage is connected with a cascade output terminal of a shift register located at a (k+4)-th stage, wherein 1≤k≤N−4; and a driving clock signal terminal of a shift register located at a (6a+1)-th stage is connected with a ninth clock signal line, a driving clock signal terminal of a shift register located at a (6a+2)-th stage is connected with a tenth clock signal line, a driving clock signal terminal of a shift register located at a (6a+3)-th stage is connected with an eleventh clock signal line, a driving clock signal terminal of a shift register located at a (6a+4)-th stage is connected with a twelfth clock signal line, a driving clock signal terminal of a shift register located at a (6a+5)-th stage is connected with a thirteenth clock signal line, a driving clock signal terminal of a shift register located at a (6a+6)-th stage is connected with a fourteenth clock signal line, a driving clock signal terminal of a shift register located at a (6b+1)-th stage is connected with a fifteenth clock signal line, a driving clock signal terminal of a shift register located at a (6b+2)-th stage is connected with a sixteenth clock signal line, a driving clock signal terminal of a shift register located at a (6b+3)-th stage is connected with a seventeenth clock signal line, a driving clock signal terminal of a shift register located at a (6b+4)-th stage is connected with an eighteenth clock signal line, a driving clock signal terminal of a shift register located at a (6b+5)-th stage is connected with a nineteenth clock signal line, and a driving clock signal terminal of a shift register located at a (6b+6)-th stage is connected with a twentieth clock signal line, wherein 6a+6≤N/2, a is an integer greater than or equal to 0, and 6b>N/2, b is a positive integer.

In some possible implementations, first clock signal terminals of shift registers located at first to (N/2)-th stages are connected with a first clock signal line, and first clock signal terminals of shift registers located at (N/2+1)-th to N-th stages are connected with a second clock signal line; and second clock signal terminals of the shift registers located at (6a+1)-th and (6a+2)-th stages are connected with a third clock signal line, second clock signal terminals of the shift registers located at (6a+3)-th to (6a+4)-th stages are connected with a fourth clock signal line, second clock signal terminals of the shift registers located at (6a+5)-th to (6a+6)-th stages are connected with a fifth clock signal line, second clock signal terminals of the shift registers located at (6b+1)-th to (6b+2)-th stages are connected with a sixth clock signal line, second clock signal terminals of the shift registers located at (6b+3)-th to (6b+4)-th stages are connected with a seventh clock signal line, and second clock signal terminals of the shift registers located at (6b+5)-th to (6b+6)-th stages are connected with an eighth clock signal line.

An embodiment of the present disclosure further provides a method for driving a shift register, which is applied to the shift register as described above. The driving method includes a display driving phase, a sensing phase and a black frame insertion phase, wherein in the display driving phase, the display pre-charge reset sub-circuit provides the signal of the first power supply terminal to the pull-up node under the control of the first signal input terminal; the pull-down control sub-circuit provides the signal of the first power supply terminal to the pull-down node under the control of the pull-up node; the output sub-circuit provides the signal of the reset power supply terminal to one or more signal output terminals under the control of the pull-down node; the output sub-circuit provides the signals of the corresponding driving clock signal terminals to the one or more signal output terminals under the control of the pull-up node; the display pre-charge reset sub-circuit provides the signal of the second power supply terminal to the pull-up node under the control of the reset signal terminal; the pull-down control sub-circuit provides the signal of the first power supply terminal to the pull-down node under the control of the pull-up node; in the sensing phase, the sensing cascade sub-circuit provides the signal of the first signal input terminal to the sensing cascade node under the control of the first random signal terminal; the sensing pre-charge reset sub-circuit provides the signal of the first clock signal terminal to the pull-up node under the control of the sensing cascade node and the first clock signal terminal; the output sub-circuit provides the signals of the corresponding driving clock signal terminals to the one or more signal output terminals under the control of the pull-up node; the sensing pre-charge reset sub-circuit provides the signal of the second power supply terminal to the pull-up node under the control of the total reset terminal; and in the black frame insertion phase, the black frame insertion cascade sub-circuit provides the signal of the second signal input terminal to the sensing cascade node under the control of the second random signal terminal; the sensing pre-charge reset sub-circuit provides the signal of the first clock signal terminal to the pull-up node under the control of the sensing cascade node and the first clock signal terminal; the output sub-circuit provides the signals of the corresponding driving clock signal terminals to the one or more signal output terminals under the control of the pull-up node; and the sensing pre-charge reset sub-circuit provides the signal of the second power supply terminal to the pull-up node under the control of the total reset terminal.

An embodiment of the present disclosure further provides a method for driving a gate drive circuit, which is applied to the gate drive circuit as described above. The method includes, during display of one frame: for a from 0 to (N/12−1), the following acts are executed in sequence: after (6a+1)-th to (6a+6)-th stages of shift registers are caused to be in the display driving phase, and (N/2+6a+1)-th to (N/2+6a+6)-th stages of shift registers are caused to be in a black frame insertion phase simultaneously, wherein a is an integer greater or equal to 0, and N is a total quantity of stages of the shift registers; and for b from N/12 to (N/6−1), the following acts are executed in sequence: after (6b+1)-th to (6b+6)-th stages of shift registers are caused to be in the display driving phase, (6b+1−N/2)-th to (6b+6−N/2)-th stages of shift registers are caused to be in the black frame insertion phase simultaneously; wherein b is an positive integer.

In some possible implementations, the method further includes, during the display of one frame: one stage shift register of first to N-th stages of shift registers is randomly caused to be in a sensing phase.

Other aspects will become apparent upon reading and understanding of accompanying drawings and the detailed description.

BRIEF DESCRIPTION OF DRAWINGS

Accompany drawings are used to provide further understanding of technical solutions of the present disclosure, and form a part of the specification, and are used to explain the technical solutions of the present disclosure together with embodiments of the present disclosure, and do not form limitation on the technical solutions of the present disclosure.

DETAILED DESCRIPTION

To make objectives, technical solutions, and advantages of the present disclosure clearer, the embodiments of the present disclosure will be described in detail with reference to the accompanying drawings. The embodiments in the present disclosure and features in the embodiments may be combined randomly with each other if there is no conflict.

Unless otherwise defined, technical terms or scientific terms used in the embodiments of the present disclosure should have the same meanings as commonly understood by those of ordinary skills in the art to which the present disclosure pertains. "First", "second", and similar terms used in the embodiments of the present disclosure do not represent any order, quantity, or significance but are only used to distinguish different components. "Include", "contain", or a similar term means that an element or object appearing before the term covers an element or object listed after the term and equivalent thereof and does not exclude other elements or objects.

It can be understood by those of skills in the art that transistors used in all the embodiments of the present disclosure may be thin film transistors, or field-effect transistors, or other devices with the same characteristic. In an exemplary embodiment, a thin film transistor used in an embodiment of the present disclosure may be an oxide semiconductor transistor. A source and a drain of the transistor used here are symmetric, so the drain and the source thereof may be interchanged. In the embodiments of the present disclosure, for distinguishing two electrodes of the transistor except the gate, one electrode is referred to as a first electrode, the other electrode is referred to as a second electrode, the first electrode may be the source or the drain, and the second electrode may be the drain or the source.

Figure 1:
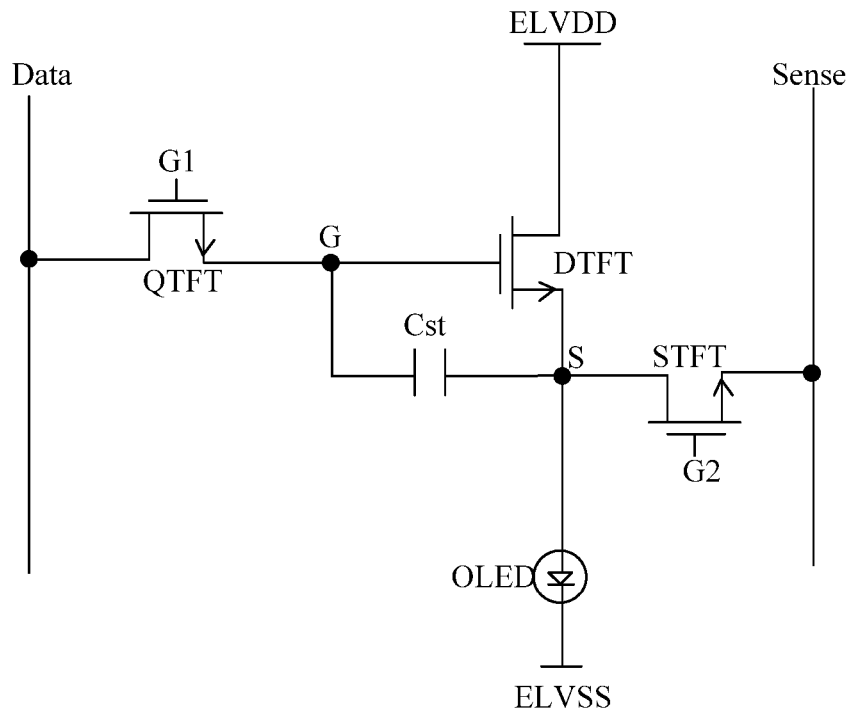
FIG. 1 is a schematic diagram of a circuit structure of a pixel circuit in an organic light emitting diode display panel.
Figure 2:
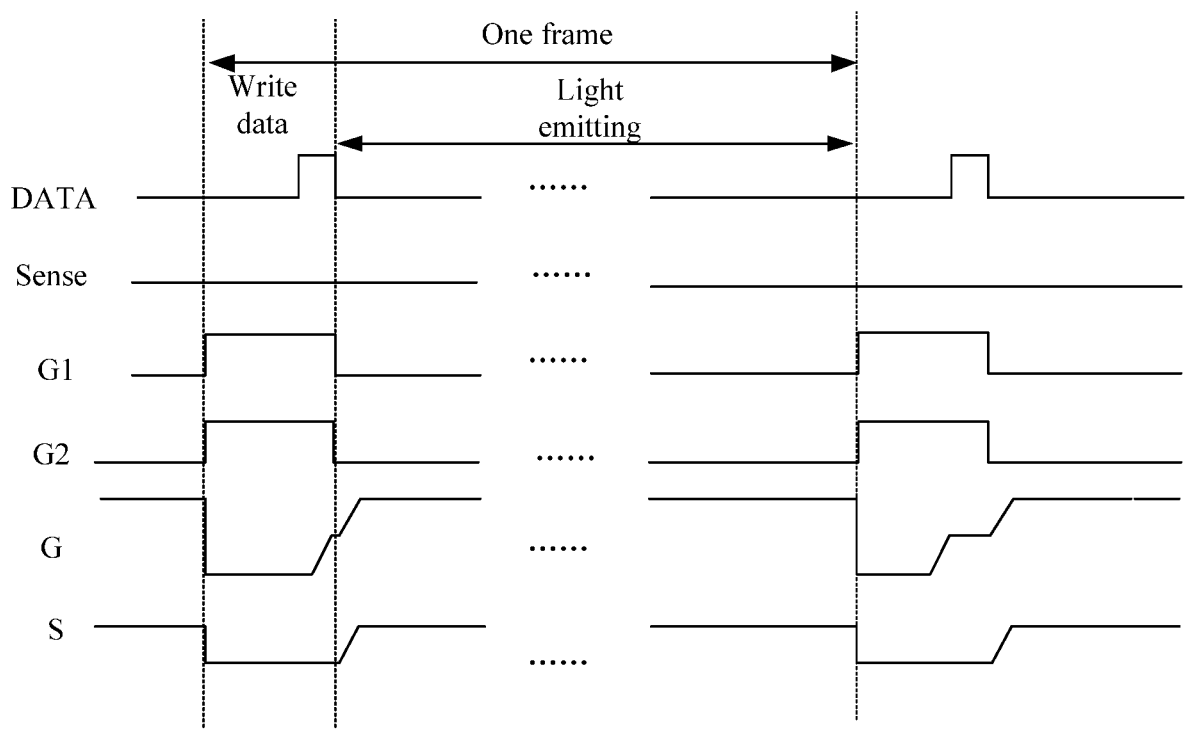
FIG. 2 is an operating timing diagram of the pixel circuit shown in FIG. 1.

FIG. 1 is a schematic diagram of a circuit structure of a pixel circuit in an organic light emitting diode display panel, and FIG. 2 is an operating timing diagram of a pixel circuit shown in FIG. 1. As shown in FIG. 1 and FIG. 2, the pixel circuit includes a display switch crystal QTFT (a control electrode thereof is connected with a gate line G1), a drive transistor DTFT, a sensing switch transistor STFT (a control electrode thereof is connected with a gate line G2) and a storage capacitor Cst. When the pixel circuit only requires external compensation, the pixel circuit at least includes the following two phases in an operating process: a pixel driving phase (including a data voltage writing process) and a pixel sensing phase (including a current reading process).

In the pixel driving phase, a data voltage Vdata in a data line Data is written into a pixel unit. In the pixel sensing phase, a test voltage VSense is written to the pixel unit through the data line Data, and an electric signal at a drain of the drive transistor is read to a signal reading line Sense through the sensing switch transistor STFT. Among them, both the data voltage writing process and the current reading process need to write an effective level voltage to a gate of the sensing switch transistor STFT through the corresponding gate line G2.

Figure 3:
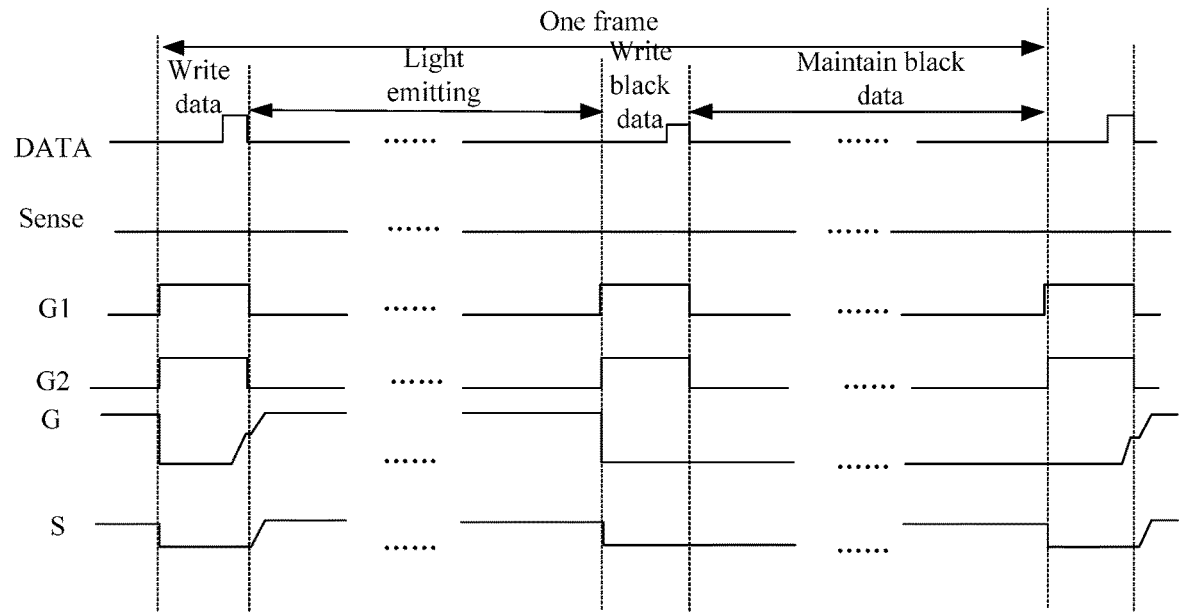
FIG. 3 is another operating timing diagram of the pixel circuit shown in FIG. 1.

In the operating process of the pixel circuit, there will be dynamic image smearing, that is, when the display panel is switched from one frame to another, a user will feel smearing of a previous frame. One solution is that, as shown in FIG. 3, a process of black frame switch of a picture is set during light emitting of the pixel circuit, which reduces light emitting time and enhances Moving Picture Response Time (MPRT). The larger the MPRT is, the lighter the smearing has. However, this will reduce a refresh frequency exponentially, for example, the original refresh frequency will change from 120 Hz to 60 Hz.

Figure 4:
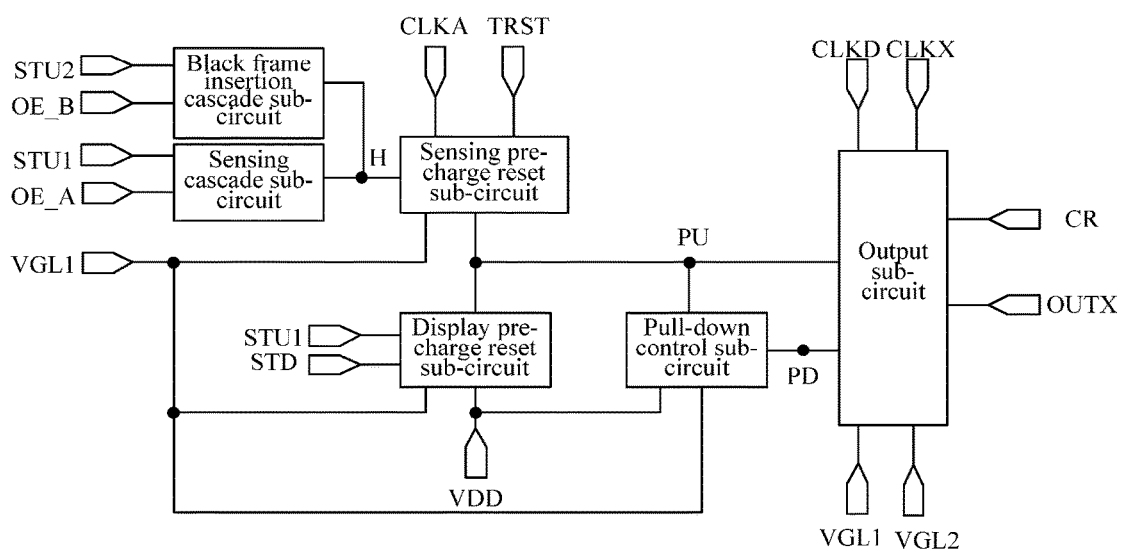
FIG. 4 is a schematic diagram of an exemplary structure of a shift register according to an embodiment of the present disclosure.

An embodiment of the present disclosure provides a shift register. FIG. 4 is a schematic structural diagram of a shift register according to an embodiment of the present disclosure. As shown in FIG. 4, the shift register provided in the embodiment of the present disclosure includes a display pre-charge reset sub-circuit, a sensing pre-charge reset sub-circuit, a pull-down control sub-circuit, an output sub-circuit, a sensing cascade sub-circuit and a black frame insertion cascade sub-circuit.

Among them, the display pre-charge reset sub-circuit is connected with a first signal input terminal STU1, a first power supply terminal VDD, a reset signal terminal STD, a second power supply terminal VGL1 and a pull-up node PU respectively, and is configured to provide a signal of the first power supply terminal VDD to the pull-up node PU under control of the first signal input terminal STU1, and provide a signal of the second power supply terminal VGL1 to the pull-up node PU under control of the reset signal terminal STD.

The sensing pre-charge reset sub-circuit is connected with a first clock signal terminal CLKA, a total reset terminal TRST, the second power supply terminal VGL1, the pull-up node PU and a sensing cascade node H respectively, and is configured to provide a signal of the first clock signal terminal CLKA to the pull-up node PU under control of the sensing cascade node H and the first clock signal terminal CLKA, and provide the signal of the second power supply terminal VGL1 to the pull-up node PU under control of the total reset terminal TRST.

The pull-down control sub-circuit is connected with the first power supply terminal VDD, the second power supply terminal VGL1, a pull-down node PD and the pull-up node PU respectively, and is configured to provide the signal of the first power supply terminal VDD or the second power supply terminal VGL1 to the pull-down node PD under control of the pull-up node PU.

The output sub-circuit is connected with the pull-up node PU, the pull-down node PD, a second clock signal terminal CLKD, a cascade output terminal CR, one or more driving clock signal terminals CLKX, signal output terminals OUTX corresponding to one or more driving clock signal terminals CLKX, the second power supply terminal VGL1 and a reset power supply terminal VGL2 respectively, and is configured to provide a signal of the second clock signal terminal CLKD to the cascade output terminal CR and provide signals of corresponding driving clock signal terminals CLKX to one or more signal output terminals under the control of the pull-up node PU, and provide the signal of the second power supply terminal VGL1 to the cascade output terminal CR and provide a signal of the reset the power supply terminal VGL2 to one or more signal output terminals OUTX under control of the pull-down node PD.

The sensing cascade sub-circuit is connected with a first random signal terminal OE_A, a first signal input terminal STU1 and the sensing cascade node H respectively, and is configured to provide a signal of the first signal input terminal STU1 to the sensing cascade node H under control of the first random signal terminal OE_A.

The black frame insertion cascade sub-circuit is connected with a second random signal terminal OE_B, a second signal input terminal STU2 and the sensing cascade node H respectively, and is configured to provide a signal of the second signal input terminal STU2 to the sensing cascade node H under control of the second random signal terminal OE_B.

In the shift register of the embodiment of the present disclosure, the black frame insertion cascade sub-circuit provides the signal of the second signal input terminal STU2 to the sensing cascade node H under the control of the second random signal terminal OE_B, so that in a display gap of a part of a screen of the display panel, the black frame insertion may be performed on another part of the screen of the display panel, thereby reducing time required for writing black data and ensuring the high refresh frequency of the display panel while enhancing the MPRT of the display panel.

Figure 5:
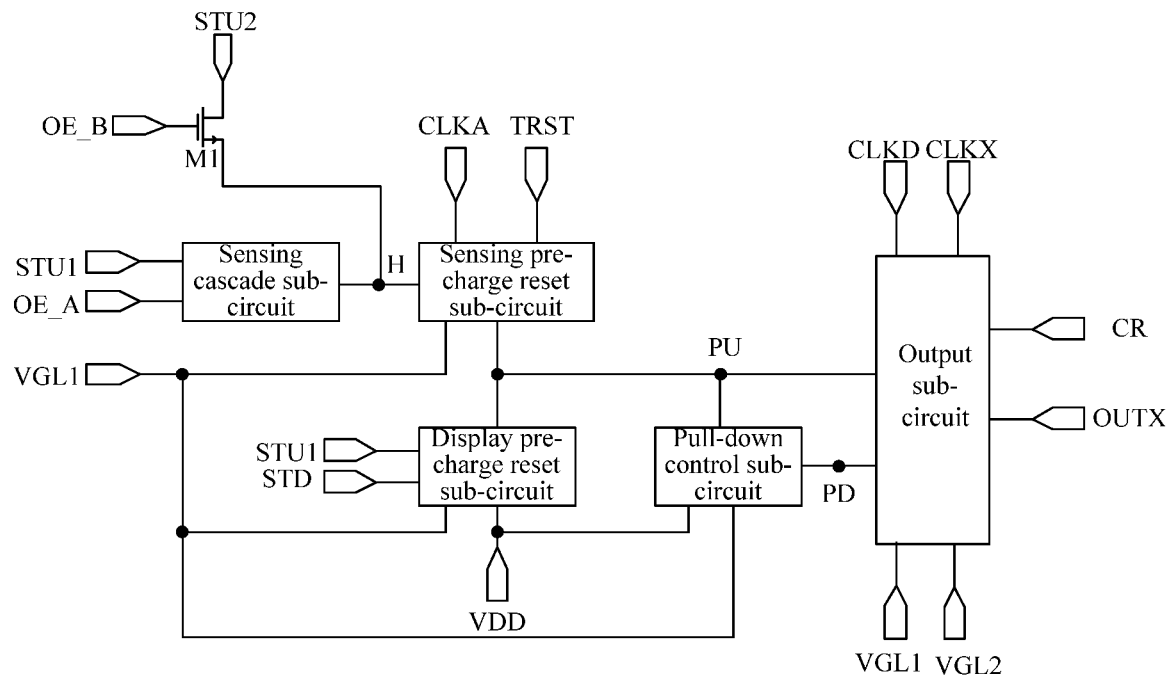
FIG. 5 is an equivalent circuit diagram of a black frame insertion cascade sub-circuit according to an embodiment of the present disclosure.

FIG. 5 is an equivalent circuit diagram of a black frame insertion cascade sub-circuit according to an embodiment of the present disclosure. In an exemplary embodiment, as illustrated in FIG. 5, the black frame insertion cascade sub-circuit according to the embodiment of the present disclosure includes a first transistor M1.

A control electrode of the first transistor M1 is connected with the second random signal terminal OE_B, a first electrode of the first transistor M1 is connected with the second signal input terminal STU2, and a second electrode of the first transistor M1 is connected with the sensing cascade node H.

FIG. 5 shows an exemplary structure of the black frame insertion cascade sub-circuit. Those of skills in the art may easily understand that implementations of the black frame insertion cascade sub-circuit are not limited thereto as long as its functions can be achieved.

Figure 6:
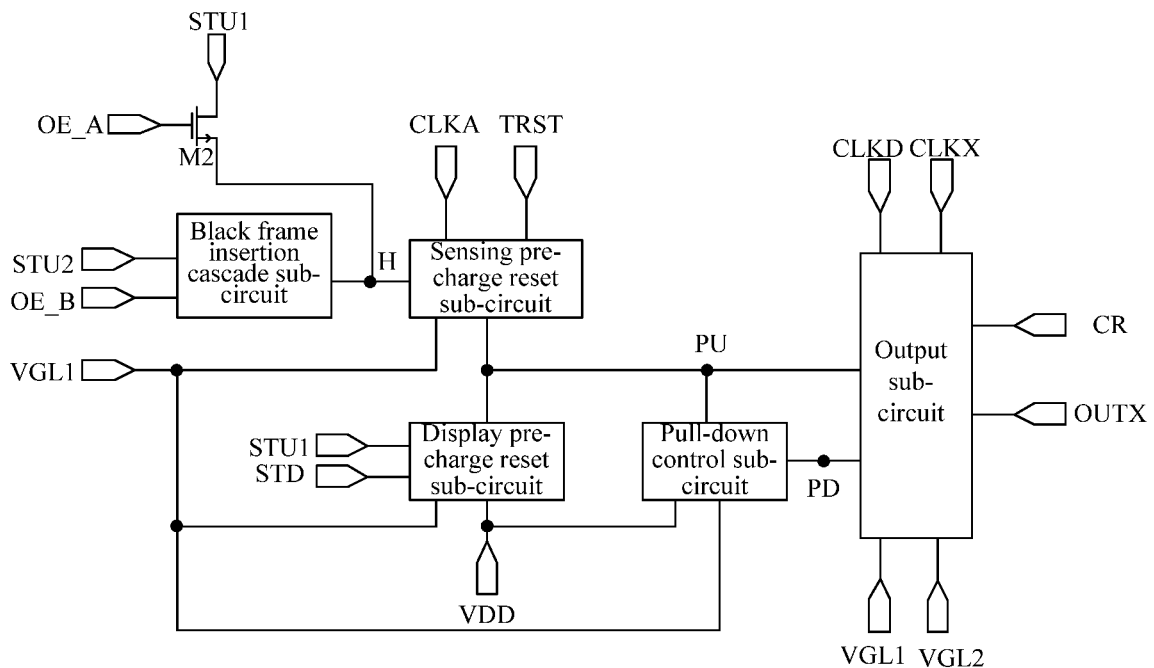
FIG. 6 is an equivalent circuit diagram of a sensing cascade sub-circuit according to an embodiment of the present disclosure.

FIG. 6 is an equivalent circuit diagram of a sensing cascade sub-circuit according to an embodiment of the present disclosure. In an exemplary embodiment, as illustrated in FIG. 6, the sensing cascade sub-circuit according to the embodiment of the present disclosure includes a second transistor M2.

A control electrode of the second transistor M2 is connected with the first random signal terminal OE_A, a first electrode of the second transistor M2 is connected with the first signal input terminal STU1, and a second electrode of the second transistor M2 is connected with the sensing cascade node H.

FIG. 6 shows an exemplary structure of the sensing cascade sub-circuit. Those of skills in the art may easily understand that implementations of the sensing cascade sub-circuit are not limited thereto as long as its functions can be achieved.

In an exemplary embodiment, the shift register further includes a first capacitor C1, wherein one terminal of the first capacitor C1 is connected with the sensing cascade node H, and the other terminal of the first capacitor C1 is connected with the second power supply terminal VGL1. The first capacitor C1 is used for keeping a voltage of the sensing cascade node H stable when the first transistor M1 or the second transistor M2 is in a turn-off state.

Figure 7:
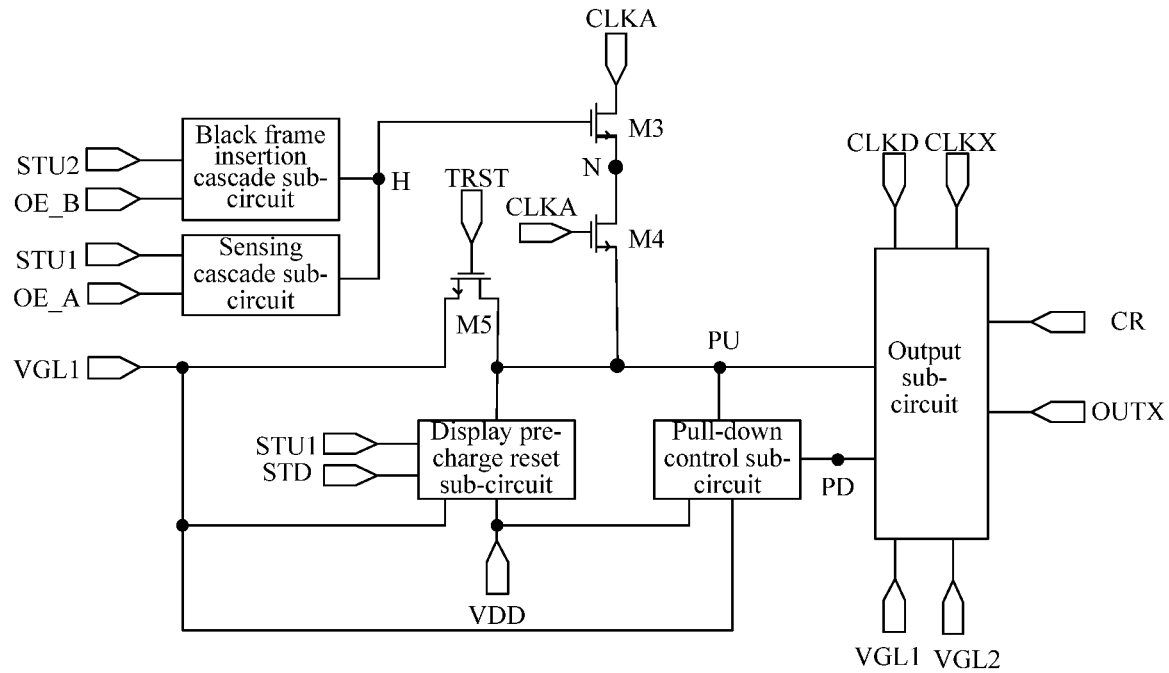
FIG. 7 is an equivalent circuit diagram of a sensing pre-charge reset sub-circuit according to an embodiment of the present disclosure.

FIG. 7 is an equivalent circuit diagram of a sensing pre-charge reset sub-circuit according to an embodiment of the present disclosure. In an exemplary embodiment, as illustrated in FIG. 7, the sensing pre-charge reset sub-circuit according to the embodiment of the present disclosure includes a third transistor M3, a fourth transistor M4 and a fifth transistor M5.

A control electrode of the third transistor M3 is connected with the sensing cascade node H, a first electrode of the third transistor M3 is connected with the first clock signal terminal CLKA, and a second electrode of the third transistor M3 is connected with a sensing pre-charge node N.

A control electrode of the fourth transistor M4 is connected with the first clock signal terminal CLKA, a first electrode of the fourth transistor M4 is connected with the sensing pre-charge node N, and a second electrode of the fourth transistor M4 is connected with the pull-up node PU.

A control electrode of the fifth transistor M5 is connected with the total reset terminal TRST, a first electrode of the fifth transistor M5 is connected with the pull-up node PU, and a second electrode of the fifth transistor M5 is connected with the second power supply terminal VGL1.

FIG. 7 shows an exemplary structure of the sensing pre-charge reset sub-circuit. Those of skills in the art may easily understand that implementations of the sensing pre-charge reset sub-circuit are not limited thereto as long as its functions can be achieved.

Figure 8:
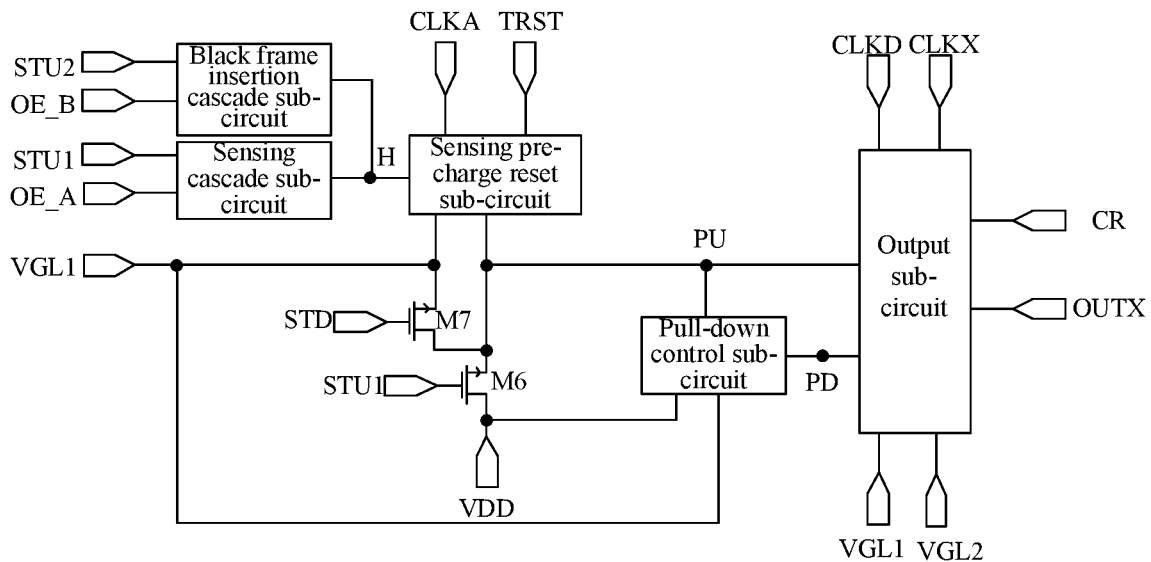
FIG. 8 is an equivalent circuit diagram of a display pre-charge reset sub-circuit according to an embodiment of the present disclosure.

FIG. 8 is an equivalent circuit diagram of a display pre-charge reset sub-circuit according to an embodiment of the present disclosure. In an exemplary embodiment, as illustrated in FIG. 8, the display pre-charge reset sub-circuit according to the embodiment of the present disclosure includes a sixth transistor M6 and a seventh M7.

A control electrode of the sixth transistor M6 is connected with the first signal input terminal STU1, a first electrode of the sixth transistor M6 is connected with the first power supply terminal VDD, and a second electrode of the sixth transistor M6 is connected with the pull-up node PU.

A control electrode of the seventh transistor M7 is connected with the reset signal terminal STD, a first electrode of the seventh transistor M7 is connected with the pull-up node PU, and a second electrode of the seventh transistor M7 is connected with the second power supply terminal VGL1.

FIG. 8 shows an exemplary structure of the display pre-charge reset sub-circuit. Those of skills in the art may easily understand that implementations of the display pre-charge reset sub-circuit are not limited to this as long as its functions can be achieved.

Figure 9:
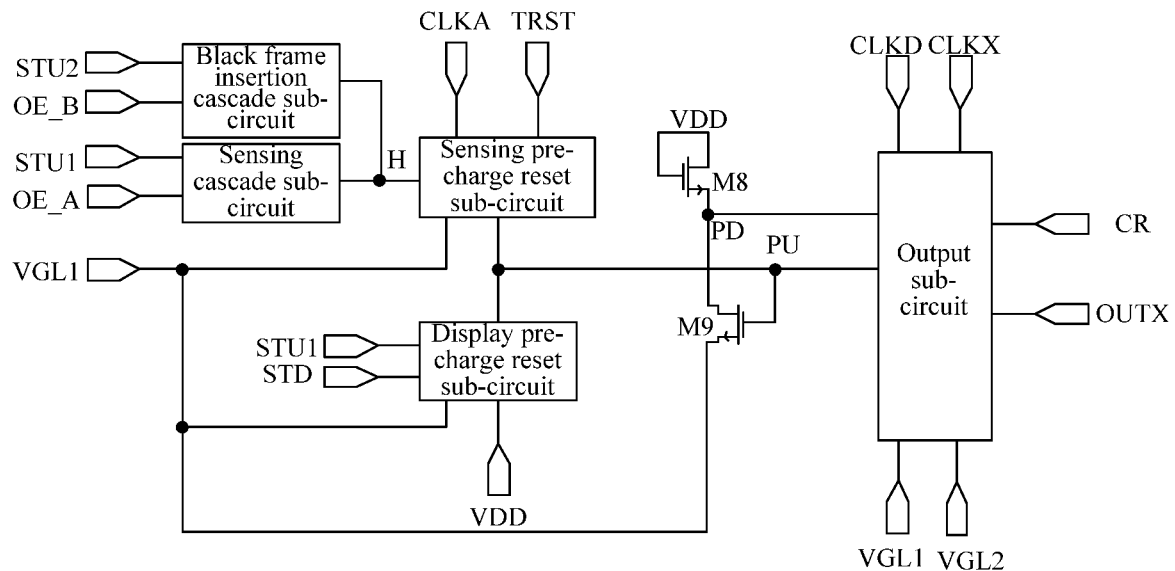
FIG. 9 is an equivalent circuit diagram of a pull-down control sub-circuit according to an embodiment of the present disclosure.

FIG. 9 is an equivalent circuit diagram of a pull-down control sub-circuit according to an embodiment of the present disclosure. In an exemplary embodiment, as illustrated in FIG. 9, the pull-down control sub-circuit according to the embodiment of the present disclosure includes an eighth transistor M8 and a ninth transistor M9.

A control electrode and a first electrode of the eighth transistor M8 are both connected with the first power supply terminal VDD, and a second electrode of the eighth transistor M8 is connected with the pull-down node PD.

A control electrode of the ninth transistor M9 is connected with the pull-up node PU, a first electrode of the ninth transistor M9 is connected with the pull-down node PD, and a second electrode of the ninth transistor M9 is connected with the second power supply terminal VGL1.

FIG. 9 shows an exemplary structure of the pull-down control sub-circuit. Those of skills in the art may easily understand that implementations of the sensing pre-charge reset sub-circuit are not limited thereto as long as its functions can be achieved.

Figure 10:
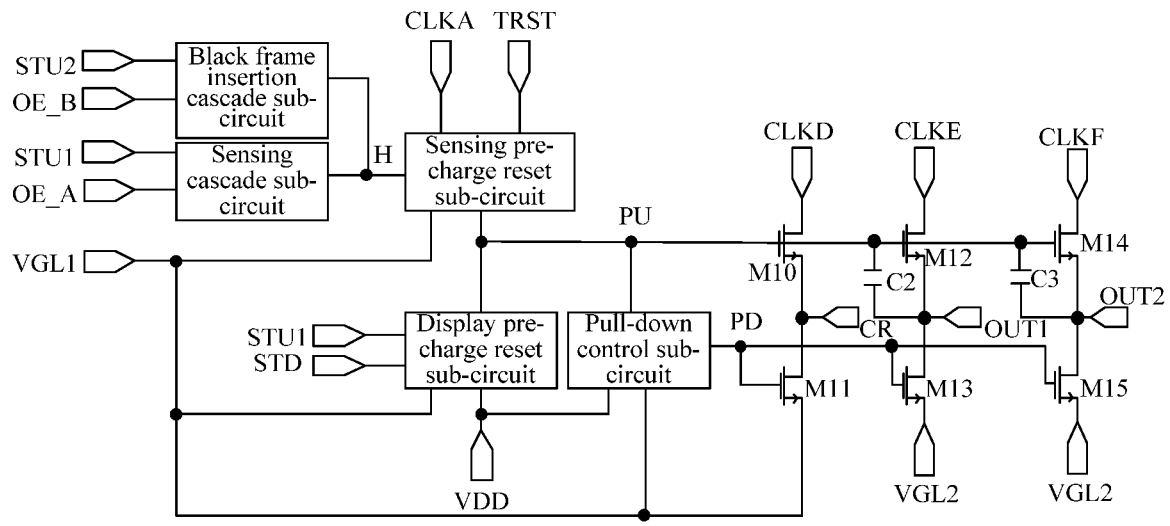
FIG. 10 is an equivalent circuit diagram of an output sub-circuit according to an embodiment of the present disclosure.

FIG. 10 is an equivalent circuit diagram of an output sub-circuit according to an embodiment of the present disclosure. In an exemplary embodiment, as shown in FIG. 10, the output sub-circuit according to the embodiment of the present disclosure includes a tenth transistor M10, an eleventh transistor M11, a twelfth transistor M12, a thirteenth transistor M13, a fourteenth transistor M14 and a fifteenth transistor M15.

A control electrode of the tenth transistor M10 is connected with the pull-up node PU, a first electrode of the tenth transistor M10 is connected with the second clock signal terminal CLKD, and a second electrode of the tenth transistor M10 is connected with the cascade output terminal CR.

A control electrode of the eleventh transistor M11 is connected with the pull-down node PD, a first electrode of the eleventh transistor M11 is connected with the cascade output terminal CR, and a second electrode of the eleventh transistor M11 is connected with the second power supply terminal VGL1.

A control electrode of the twelfth transistor M12 is connected with the pull-up node PU, a first electrode of the twelfth transistor M12 is connected with a first driving clock signal terminal CLKE, and a second electrode of the twelfth transistor M12 is connected with the first signal output terminal OUT1.

A control electrode of the thirteenth transistor M13 is connected with the pull-down node PD, a first electrode of the thirteenth transistor M13 is connected with the first signal output terminal OUT1, and a second electrode of the thirteenth transistor M13 is connected with the reset power supply terminal VGL2.

A control electrode of the fourteenth transistor M14 is connected with the pull-up node PU, a first electrode of the fourteenth transistor M14 is connected with a second driving clock signal terminal CLKF, and a second electrode of the fourteenth transistor M14 is connected with a second signal output terminal OUT2.

A control electrode of the fifteenth transistor M15 is connected with the pull-down node PD, a first electrode of the fifteenth transistor M15 is connected with the second signal output terminal OUT2, and a second electrode of the fifteenth transistor M15 is connected with the reset power supply terminal VGL2.

FIG. 10 shows an exemplary structure of an output sub-circuit by taking two signal output terminals (the first signal output terminal OUT1 and the second signal output terminal OUT2) as an example, and the two signal output terminals OUT1 and OUT2 are respectively connected with the gate lines G1 and G2 in the 3T1C pixel circuit shown in FIG. 1. Those of skills in the art may easily understand that implementations of the output sub-circuit are not limited thereto as long as its functions can be achieved. For example, when the pixel circuit (for example, the pixel circuit may be a 2T1C pixel circuit) includes only one gate line, a quantity of the signal output terminals may be one, or when the pixel circuit (for example, the pixel circuit may be a 4T2C pixel circuit, a 5T2C pixel circuit, etc.) includes three or more gate lines, a quantity of the signal output terminals may be three or more.

In an exemplary embodiment, as shown in FIG. 10, the output sub-circuit further includes a second capacitor C2 and a third capacitor C3, wherein one terminal of the second capacitor C2 is connected with the pull-up node PU, and the other terminal of the second capacitor C2 is connected with the first signal output terminal OUT1. One terminal of the third capacitor C3 is connected with the pull-up node PU, and the other terminal of the third capacitor C3 is connected with the second signal output terminal OUT2. The second capacitor C2 and the third capacitor C3 may be used for ensuring that the voltage of the pull-up node PU is always in an effective level state in the display output phase and the sensing output phase. In this embodiment, the second capacitor C2 may be a parasitic capacitor of the twelfth transistor M12 or an external capacitor. The third capacitor C3 may be a parasitic capacitor of the fourteenth transistor M14 or an external capacitor.

Figure 11:
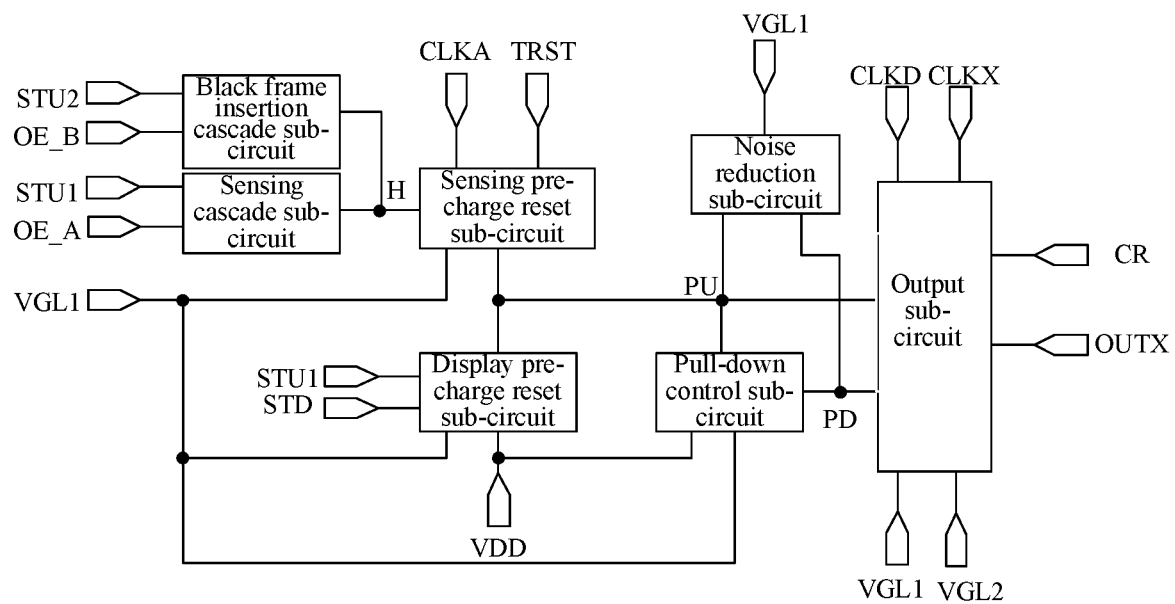
FIG. 11 is a schematic diagram of another exemplary structure of a shift register according to an embodiment of the present disclosure.
Figure 12:
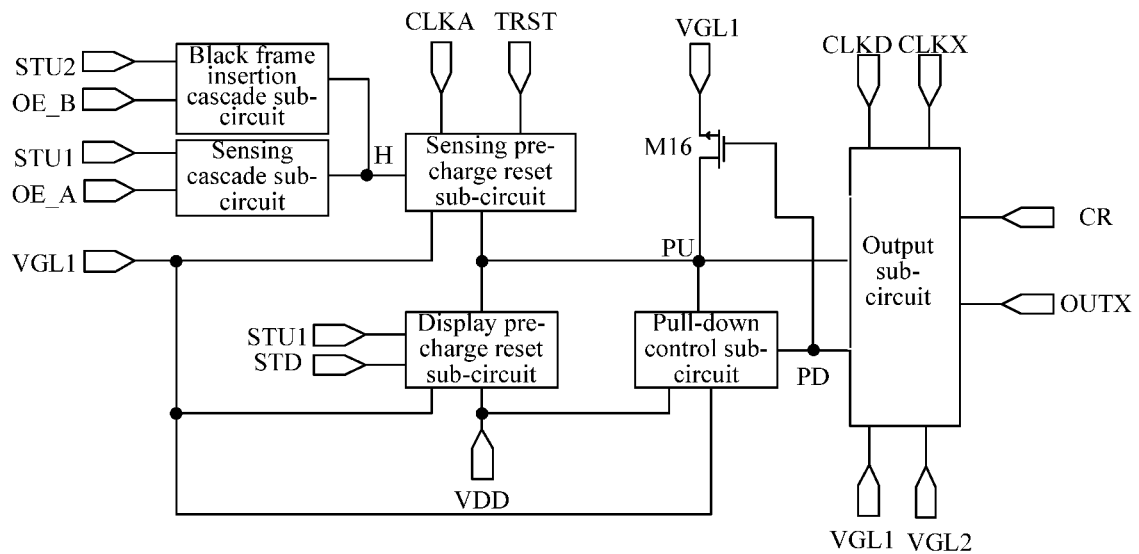
FIG. 12 is an equivalent circuit diagram of a noise reduction sub-circuit according to an embodiment of the present disclosure.

In an exemplary embodiment, as shown in FIG. 11, the shift register further includes a noise reduction sub-circuit, wherein the noise reduction sub-circuit is connected with the pull-up node PU, the pull-down node PD and the second power supply terminal VGL1 respectively, and is configured to provide the signal of the second power supply terminal VGL1 to the pull-up node PU under the control of the pull-down node PD, so that noise at the pull-up node PU is released to maintain a stable voltage at the pull-up node PU In an exemplary embodiment, as shown in FIG. 12, the noise reduction sub-circuit includes a sixteenth transistor M16, wherein a control electrode of the sixteenth transistor M16 is connected with the pull-down node PD, a first electrode of the sixteenth transistor M16 is connected with the pull-up node PU, and a second electrode of the sixteenth transistor M16 is connected with the second power supply terminal VGL1.

Figure 13:
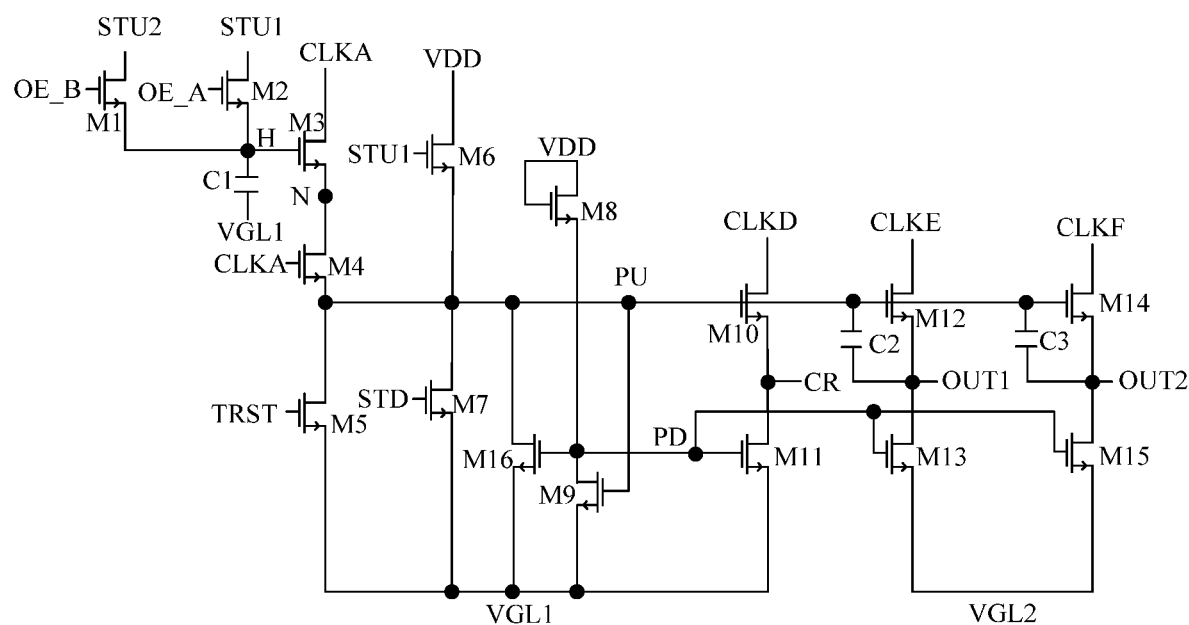
FIG. 13 is an equivalent circuit diagram of a shift register according to an embodiment of the present disclosure.

FIG. 13 is an equivalent circuit diagram of a shift register according to an embodiment of the present disclosure. As shown in FIG. 13, in the shift register according to an embodiment of the present disclosure, a black frame insertion cascade sub-circuit includes a first transistor M1, a sensing cascade sub-circuit includes a second transistor M2, a sensing pre-charge reset sub-circuit includes a third transistor M3, a fourth transistor M4 and a fifth transistor M5, and a display pre-charge reset sub-circuit includes a sixth transistor M6 and a seventh transistor M7. A pull-down control sub-circuit includes an eighth transistor M8 and a ninth transistor M9, an output sub-circuit includes a tenth transistor M10, an eleventh transistor M11, a twelfth transistor M12, a thirteenth transistor M13, a fourteenth transistor M14 and a fifteenth transistor M15. The shift register further includes a noise reduction sub-circuit, a first capacitor C1, a second capacitor C2 and a third capacitor C3, and the noise reduction sub-circuit includes a sixteenth transistor M16.

A control electrode of the first transistor M1 is connected with the second random signal terminal OE_B, a first electrode of the first transistor M1 is connected with the second signal input terminal STU2, and a second electrode of the first transistor M1 is connected with the sensing cascade node H. A control electrode of the second transistor M2 is connected with the first random signal terminal OE_A, a first electrode of the second transistor M2 is connected with the first signal input terminal STU1, and a second electrode of the second transistor M2 is connected with the sensing cascade node H. One terminal of the first capacitor C1 is connected with the sensing cascade node H, and the other terminal of the first capacitor C1 is connected with the second power supply terminal VGL1. A control electrode of the third transistor M3 is connected with the sensing cascade node H, a first electrode of the third transistor M3 is connected with the first clock signal terminal CLKA, and a second electrode of the third transistor M3 is connected with the sensing pre-charge node N. A control electrode of the fourth transistor M4 is connected with the first clock signal terminal CLKA, a first electrode of the fourth transistor M4 is connected with the sensing pre-charge node N, and a second electrode of the fourth transistor M4 is connected with the pull-up node PU. A control electrode of the fifth transistor M5 is connected with the total reset terminal TRST, a first electrode of the fifth transistor M5 is connected with the pull-up node PU, and a second electrode of the fifth transistor M5 is connected with the second power supply terminal VGL1. A control electrode of the sixth transistor M6 is connected with the first signal input terminal STU1, a first electrode of the sixth transistor M6 is connected with the first power supply terminal VDD, and a second electrode of the sixth transistor M6 is connected with the pull-up node PU. A control electrode of the seventh transistor M7 is connected with the reset signal terminal STD, a first electrode of the seventh transistor M7 is connected with the pull-up node PU, and a second electrode of the seventh transistor M7 is connected with the second power supply terminal VGL1. A control electrode and a first electrode of the eighth transistor M8 are both connected with the first power supply terminal VDD, and a second electrode of the eighth transistor M8 is connected with the pull-down node PD. A control electrode of the ninth transistor M9 is connected with the pull-up node PU, a first electrode of the ninth transistor M9 is connected with the pull-down node PD, and a second electrode of the ninth transistor M9 is connected with the second power supply terminal VGL1. A control electrode of the tenth transistor M10 is connected with the pull-up node PU, a first electrode of the tenth transistor M10 is connected with the second clock signal terminal CLKD, and a second electrode of the tenth transistor M10 is connected with the cascade output terminal CR. A control electrode of the eleventh transistor M11 is connected with the pull-down node PD, a first electrode of the eleventh transistor M11 is connected with the cascade output terminal CR, and a second electrode of the eleventh transistor M11 is connected with the second power supply terminal VGL1. A control electrode of the twelfth transistor M12 is connected with the pull-up node PU, a first electrode of the twelfth transistor M12 is connected with the first driving clock signal terminal CLKE, and a second electrode of the twelfth transistor M12 is connected with the first signal output terminal OUT1. A control electrode of the thirteenth transistor M13 is connected with the pull-down node PD, a first electrode of the thirteenth transistor M13 is connected with the first signal output terminal OUT1, and a second electrode of the thirteenth transistor M13 is connected with the reset power supply terminal VGL2. A control electrode of the fourteenth transistor M14 is connected with the pull-up node PU, a first electrode of the fourteenth transistor M14 is connected with the second driving clock signal terminal CLKF, and a second electrode of the fourteenth transistor M14 is connected with the second signal output terminal OUT2. A control electrode of the fifteenth transistor M15 is connected with the pull-down node PD, a first electrode of the fifteenth transistor M15 is connected with the second signal output terminal OUT2, and a second electrode of the fifteenth transistor M15 is connected with the reset power supply terminal VGL2. One terminal of the second capacitor C2 is connected with the pull-up node PU, and the other terminal of the second capacitor C2 is connected with the first signal output terminal OUT1. One terminal of the third capacitor C3 is connected with the pull-up node PU, and the other terminal of the third capacitor C3 is connected with the second signal output terminal OUT2. A control electrode of the sixteenth transistor M16 is connected with the pull-down node PD, a first electrode of the sixteenth transistor M16 is connected with the pull-up node PU, and a second electrode of the sixteenth transistor M16 is connected with the second power supply terminal VGL1.

FIG. 13 shows exemplary structures of the black frame insertion cascade sub-circuit, the sensing cascade sub-circuit, the sensing pre-charge reset sub-circuit, the display pre-charge reset sub-circuit, the pull-down control sub-circuit, the output sub-circuit and the noise reduction sub-circuit. Those skilled in the art easily understand that implementations of the above sub-circuits are not limited thereto as long as their functions may be achieved.

In an exemplary embodiment, each of the transistors M1 to M16 may be an N-type transistor or a P-type transistor, so that process flow may be unified, manufacturing process flow may be reduced, and the product yield may be improved. In an exemplary embodiment, considering that leakage current of a low-temperature polysilicon thin film transistor is smaller, all transistors in the embodiment of the present disclosure may be low-temperature polysilicon thin film transistors, and for thin film transistors, thin film transistors with a bottom gate structure or thin film transistors with a top gate structure may be selected as long as a switch function can be achieved.

When a transistor is an N-type transistor, its turn-on voltage is a high-level voltage and its turn-off voltage is a low-level voltage. When the transistor is a P-type transistor, its turn-on voltage is a low-level voltage and its turn-off voltage is a high-level voltage. In the following description of each embodiment, an exemplary illustration is made by taking all transistors as N-type transistors. In an exemplary embodiment, multiple transistors in the following embodiments may also be replaced by P-type transistors.

In the embodiments of the present disclosure, an image frame may be divided into three phases: a display driving phase, a sensing phase and a black frame insertion phase. In the display driving phase, each row of pixel units in a display panel completes display driving. In the sensing phase, a certain row of pixel units in the display panel completes current extraction (i.e. sensing). In the black frame insertion phase, each row of pixel units in the display panel is inserted with black data.

Figure 14:
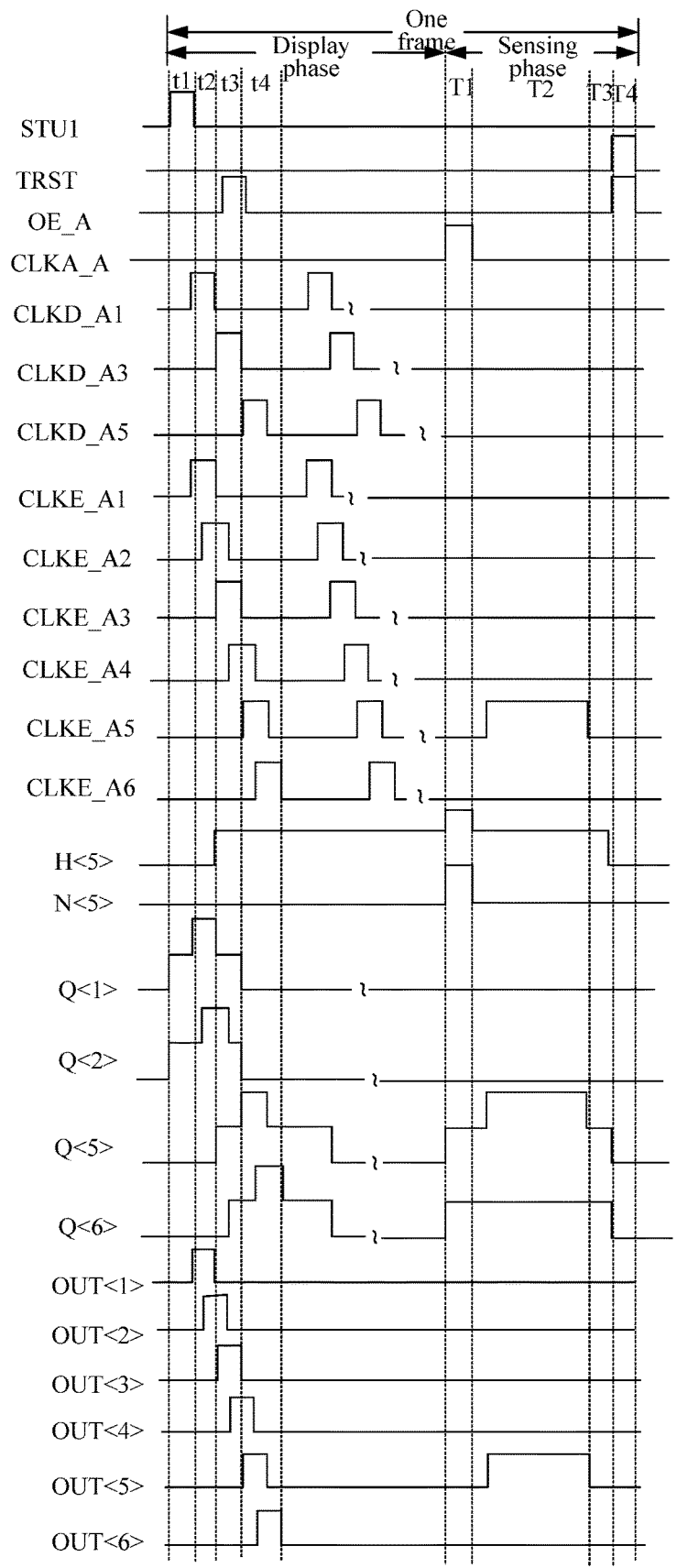
FIG. 14 is an operating timing diagram of the shift register shown in FIG. 13 in a display driving phase and a sensing phase.
Figure 15:
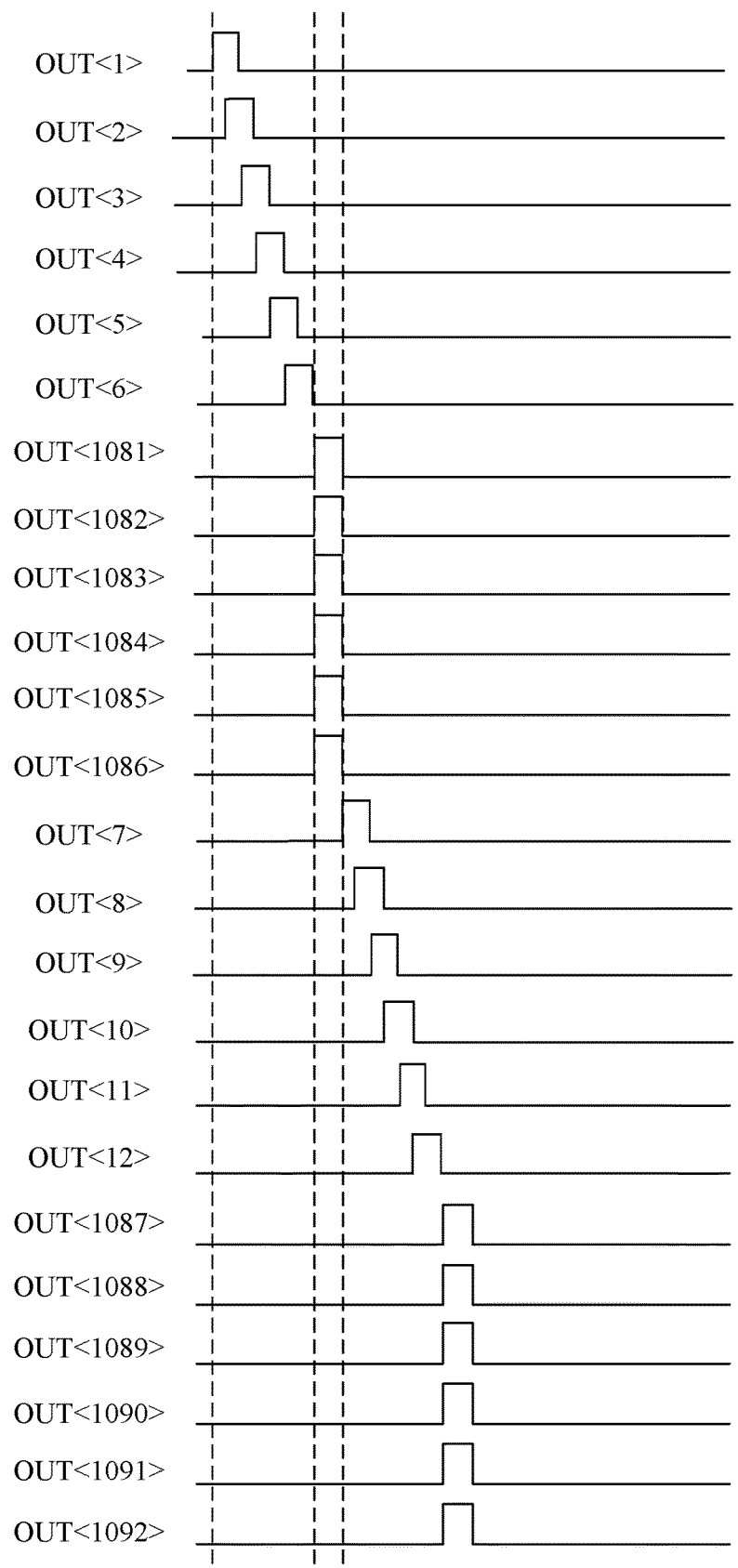
FIG. 15 is a schematic diagram of a sequence of display and frame black insertion after cascade of shift registers shown in FIG. 13.
Figure 16:
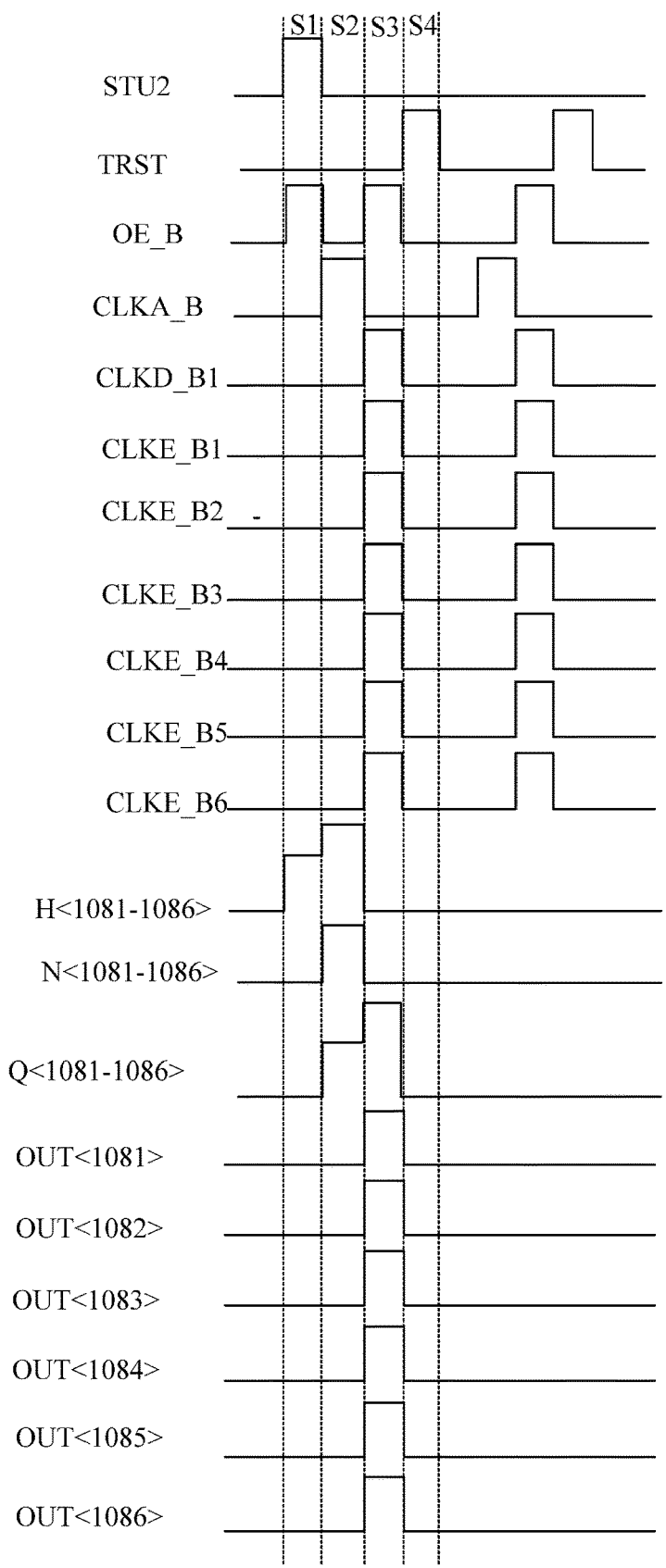
FIG. 16 is an operating timing diagram of the shift register shown in FIG. 13 in a black frame insertion phase.

FIG. 14 is an operating timing diagram of the shift register shown in FIG. 13 in a display driving phase and a sensing phase. FIG. 15 is a schematic diagram of sequence of display and black frame insertion after cascade of multiple the shift registers according to an embodiment of the present disclosure. FIG. 16 is an operating timing diagram of the shift register shown in FIG. 13 in a black frame insertion phase. The operating process of the shift register shown in FIG. 13 will be described with reference to FIG. 14 to FIG. 16. Among them, in this embodiment, it is assumed that all transistors are transistors turned on by a high level, a first working voltage provided by the first power supply terminal VDD is a high-level voltage, the first working voltage is a DC high-potential signal, a second working voltage provided by the second power supply terminal VGL1 is a low-level voltage, a reset working voltage provided by the reset power supply terminal VGL2 is a low-level voltage, wherein the second working voltage is smaller than the reset working voltage, and both the second working voltage and the reset working voltage are negative.

Taking the operating process of a first stage of shift register as an example, as shown in FIG. 14, the operating process of the display driving phase includes the followings:

In a t1 phase, an input signal of the first signal input terminal STU1 is a high level, and input signals of the reset signal terminal STD, the first clock signal terminal CLKA, the second clock signal terminal CLKD, the first driving clock signal terminal CLKE and the second driving clock signal terminal CLKF are all at low levels. The high level input from the first signal input terminal STU1 turns on the sixth transistor M6, and a high voltage is written into the pull-up node PU and the pull-up node PU is kept at high potential. As the potential of the pull-up node PU is pulled up, the ninth transistor M9 is turned on, and the potential of the pull-down node PD is pulled down. At this time, as the input signals of the second clock signal terminal CLKD, the first driving clock signal terminal CLKE and the second driving clock signal terminal CLKF are at low levels, the cascade output terminal CR, the first signal output terminal OUT1 and the second signal output terminal OUT2 are all in a low-level state.

In a t2 phase, the input signals of the second clock signal terminal CLKD, the first driving clock signal terminal CLKE and the second driving clock signal terminal CLKF are all at high levels, and the input signals of the first signal input terminal STU1, the reset signal terminal STD, the total reset terminal TRST, the first random signal terminal OE_A, the second random signal terminal OE_B and the first clock signal terminal CLKA are all at low levels. The pull-up node remains at a high potential due to the existence of the second capacitor and the third capacitor. The tenth transistor M10, the twelfth transistor M12 and the fourteenth transistor M14 are turned on, and the cascade output terminal CR, the first signal output terminal OUT1 and the second signal output terminal OUT2 all output high-level signals.

In a t3 phase, the input signals of the second clock signal terminal CLKD, the first driving clock signal terminal CLKE and the second driving clock signal terminal CLKF are all at low levels. The pull-up node still is kept at a high potential due to the existence of the second capacitor and the third capacitor, and the tenth transistor M10, the twelfth transistor M12 and the fourteenth transistor M14 are still turned on. As the input signals of the second clock signal terminal CLKD, the first driving clock signal terminal CLKE and the second driving clock signal terminal CLKF turn to low levels, the cascade output terminal CR, the first signal output terminal OUT1 and the second signal output terminal OUT2 all output low-level signals.

In a t4 phase, the input signal of the reset signal terminal STD is at a high level, and the input signals of the first signal input terminal STU1, the first clock signal terminal CLKA, the second clock signal terminal CLKD, the first driving clock signal terminal CLKE and the second driving clock signal terminal CLKF are all at low levels. The seventh transistor M7 is turned on and the potential of the pull-up node PU is pulled down, so the reset is completed. The eighth transistor M8 is turned on, the potential of the pull-down node PD is pulled up, the sixteenth transistor M16 is turned on, and the potential of the pull-up node PU is pulled down, so that noise at the pull-up node is released. The eleventh transistor M11, the thirteenth transistor M13 and the fifteenth transistor M15 are turned on, so that the cascade output terminal CR, the first signal output terminal OUT1 and the second signal output terminal OUT2 all output low-level signals.

Among them, the input signals of the first clock signal terminal CLKA, the second clock signal terminal CLKD, the first driving clock signal terminal CLKE, the second driving clock signal terminal CLKF and the total reset terminal TRST may all be clock signals generated by an external control circuit.

The above is the operating process of the display driving phase corresponding to the first stage of shift register, and then it is transferred in sequence until the display of the last stage of shift register is completed, and the display driving phase of the frame ends. The shift register of the present disclosure achieves random compensation for any row of sub-pixel units in the display panel at one time in the display driving process of one frame, and in a display gap of a part of a screen of the display panel, writes black data to another part of the screen of the display panel.

The shift register of the embodiment of the present disclosure may achieve random compensation, thus avoiding the poor display problems such as uniformity of scanning lines and display brightness caused by row-by-row sequential compensation. The random compensation described in the embodiment of the present disclosure refers to an external compensation method different from the row-by-row sequential compensation. In a sensing period of a certain frame, sensing driving signals corresponding to any row of sub-pixel units in the display panel may be randomly output, and any row of sub-pixel units are randomly selected.

Assuming that a fifth row of sub-pixel units of the display panel are randomly compensated in the sensing period of this frame, a waveform pulse width of the signal output from the first random signal terminal OE_A is the same as that of a cascade output terminal CR<3> of a third stage of shift register, so when the cascade output terminal CR<3> of the third stage of shift register outputs, a sensing cascade node H<5> of a fifth stage of shift register will be charged (there are overlaps on the output waveforms). The high potential of the sensing cascade node H<5> of the fifth stage of shift register will remain after the signal of the first random signal terminal OE_A turns to a low potential.

In this process, the fourth transistor M4 is always in the turn-off state, thus isolating the influence of the sensing cascade node H and the sensing pre-charge node N on the display phase.

As shown in FIG. 14, the operating process of the sensing phase includes the followings.

In a T1 phase, the input signal of the first clock signal terminal CLKA is at a high level. Since the sensing cascade node H<5> is at a high level, the third transistor M3 is turned on, the potential of the sensing pre-charge node N<5> is pulled up, the fourth transistor M4 is turned on, and the potential of the pull-up node PU is pulled up.

In a T2 phase, the input signals of the first clock signal terminal CLKA and the second clock signal terminal CLKD are at low levels, and the input signals of the first driving clock signal terminal CLKE and the second driving clock signal terminal CLKF are both at high levels. The pull-up node is kept at a high potential due to the existence of the second capacitor C2 and the third capacitor C3, the tenth transistor M10, the twelfth transistor M12 and the fourteenth transistor M14 are turned on, and the first signal output terminal OUT1<5> and the second signal output terminal OUT2<5> both output high-level signals.

In a T3 phase, the input signals of the first clock signal terminal CLKA, the second clock signal terminal CLKD, the first driving clock signal terminal CLKE and the second driving clock signal terminal CLKF are all at low levels. The first signal output terminal OUT1<5> and the second signal output terminal OUT2<5> both output low-level signals.

In the T4 phase, the input signals of the first random signal terminal OE_A and the total reset terminal TRST are both at high levels, the second transistor M2 is turned on, the fifth transistor M5 is turned on, and the sensing cascade nodes H and the pull-up nodes PU of all rows are reset.

Thus, random compensation may be achieved, that is, the drive transistors of any row of pixels may be compensated at any frame.

In the shift register of the embodiment of the present disclosure, in a display gap of a part of a screen of the display panel, black data is written to another part of the screen of the display panel, and the same black data is simultaneously written to multiple rows during black frame insertion. In an exemplary embodiment, as shown in FIG. 15, each half screen is normally displayed in cascade, and after the display data is written to 1st to 6th rows in sequence, black frame insertion data is inserted into 1081st to 1086th rows; then, after the display data is written to 7th to 12th rows in sequence, the black frame insertion data are inserted into 1087th to 1092th rows, . . . . In this process, the time required for writing black data is greatly shortened, and the problem of the refresh frequency reduction caused by black frame insertion is greatly reduced. According to the embodiment of the present disclosure, the black frame insertion is performed simultaneously on 6 rows of sub-pixel units as a group. In some possible implementations, the black frame insertion may be also performed simultaneously on any quantity of rows of sub-pixel units as a group except the 6 rows, which is not limited in the present disclosure.

In an exemplary embodiment, it is assumed that the display panel includes a total of 2160 rows of sub-pixel units (i.e., the total quantity of shift registers N=2160), the second signal input terminals STU2 of the 1st to 6th stages of shift registers are connected with a black frame insertion start signal input terminal STV2, and the second signal input terminals STU2 of the shift registers located at (6m+1)-th to (6m+6)-th stages are connected with the cascade output terminal CR<6m> of the shift register located at a 6m-th stage, wherein m is a positive integer.

Taking the sub-pixel units in the 1081st to 1086th rows as an example, as shown in FIG. 16, the operating process of the black frame insertion phase includes the following:

In a S1 phase, the input signals of the second signal input terminal STU2 (that is, the cascade output terminal CR<1080> of the 1080th stage of shift register) and the second random signal terminal OE_B are all at high levels, and high potentials are all written into the sensing cascade nodes H<1081> to H<1086> of the 1081st to 1086th rows.

In a S2 phase, the input signal of the first clock signal terminal CLKA is at a high level. Since the sensing cascade nodes H<1081> to H<1086> are at high levels, the third transistor M3 is turned on, the potentials of the sensing pre-charge nodes N<1081> to N<1086> are pulled up, the fourth transistor M4 is turned on, and the potentials of the pull-up nodes PU of the 1081st to 1086th rows are pulled up.

In a S3 phase, the input signals of the second random signal terminal OE_B, the second clock signal terminal CLKD, the first driving clock signal terminal CLKE and the second driving clock signal terminal CLKF are all at high level. Cascade output terminals CR<1081> to CR<1086> of the 1081st to 1086th rows, first signal output terminals OUT1<1081> to OUT1<1086> and second signal output terminals OUT2<1081> to OUT2<1086> all output high-level signals. Moreover, since the second random signal terminal OE_B is at high potential, the high potential output by the cascade output terminal CR<1086> in the 1086th row is written into the sensing cascade nodes H<1087> to H<1092> of the 1087th to 1092nd rows, while the sensing cascade nodes H<1081> to H<1086> of the 1081st to 1086th rows are reset.

In a S4 phase, the input signal of the total reset terminal TRST is at a high level, and the pull-up nodes PU of the 1081st to 1086th rows are reset.

In the shift register of the embodiment of the present disclosure, the signal of the second signal input terminal STU2 is provided to the sensing cascade node H by the black frame insertion cascade sub-circuit under the control of the second random signal terminal OE_B, which may perform, in a display gap of a part of a screen of the display panel, the black frame insertion on another part of the screen of the display panel, thereby reducing the time required for writing black data and ensuring the high refresh frequency of the display panel while enhancing the MPRT of the display panel.

In addition, in the shift register of the embodiment of the present disclosure, the black frame insertion cascade sub-circuit and the sensing cascade sub-circuit share a sensing pre-charge reset sub-circuit, and the display pre-charge reset sub-circuit and the sensing pre-charge reset sub-circuit share a pull-down control sub-circuit and an output sub-circuit, so that an area occupied by the shift register unit may be reduced, and the frame size of the display device using the shift register unit may be reduced, thereby improving Pixels Per Inch (PPI) of the display device.

Some embodiments of the present disclosure further provide a method for a driving shift register, which is applied to the shift register according to the previous embodiments. The shift register includes a display pre-charge reset sub-circuit, a sensing pre-charge reset sub-circuit, a pull-down control sub-circuit, an output sub-circuit, a sensing cascade sub-circuit and a black frame insertion cascade sub-circuit, a first power supply terminal, a second power supply terminal, a third power supply terminal, a first clock signal terminal, a second clock signal terminal, one or more driving clock signal terminals, a cascade output terminal, one or more signal output terminals, a first signal input terminal, a second signal input terminal, a reset signal terminal, a total reset terminal, a first random signal terminal and a second random signal terminal. The method for driving the shift register includes a display driving phase, a sensing phase and a black frame insertion phase.

In the display driving phase, the display pre-charge reset sub-circuit provides a signal of the first power supply terminal to the pull-up node under control of the first signal input terminal. The pull-down control sub-circuit provides the signal of the first power supply terminal to the pull-down node under control of the pull-up node; the output sub-circuit provides a signal of the reset power supply terminal to one or more signal output terminals under control of the pull-down node. The output sub-circuit provides signals of corresponding driving clock signal terminals to one or more signal output terminals under the control of the pull-up node. The display pre-charge reset sub-circuit provides a signal of second power supply terminal to the pull-up node under control of the reset signal terminal. The pull-down control sub-circuit provides the signal of the first power supply terminal to the pull-down node under the control of the pull-up node.

In the sensing phase, the sensing cascade sub-circuit provides a signal of the first signal input terminal to the sensing cascade node under control of the first random signal terminal. The sensing pre-charge reset sub-circuit provides a signal of the first clock signal terminal to the pull-up node under control of the sensing cascade node and the first clock signal terminal. The output sub-circuit provides signals of the corresponding driving clock signal terminals to one or more signal output terminals under the control of the pull-up node. The sensing pre-charge reset sub-circuit provides the signal of the second power supply terminal to the pull-up node under control of the total reset terminal.

In the black frame insertion phase, the black frame insertion cascade sub-circuit provides a signal of the second signal input terminal to the sensing cascade node under control of the second random signal terminal. The sensing pre-charge reset sub-circuit provides the signal of the first clock signal terminal to the pull-up node under control of the sensing cascade node and the first clock signal terminal. The output sub-circuit provides signals of the corresponding driving clock signal terminals to one or more signal output terminals under the control of the pull-up node. The sensing pre-charge reset sub-circuit provides the signal of the second power supply terminal to the pull-up node under the control of the total reset terminal.

In the method for driving the shift register according to the embodiment of the present disclosure, the signal of the second signal input terminal is provided to the sensing cascade node by the black frame insertion cascade sub-circuit under the control of the second random signal terminal, which may perform, in a display gap of a part of a screen of the display panel, the black frame insertion on another part of the screen of the display panel, thereby reducing the time required for writing black data and ensuring the high refresh frequency of the display panel while enhancing the MPRT of the display panel.

Figure 17:
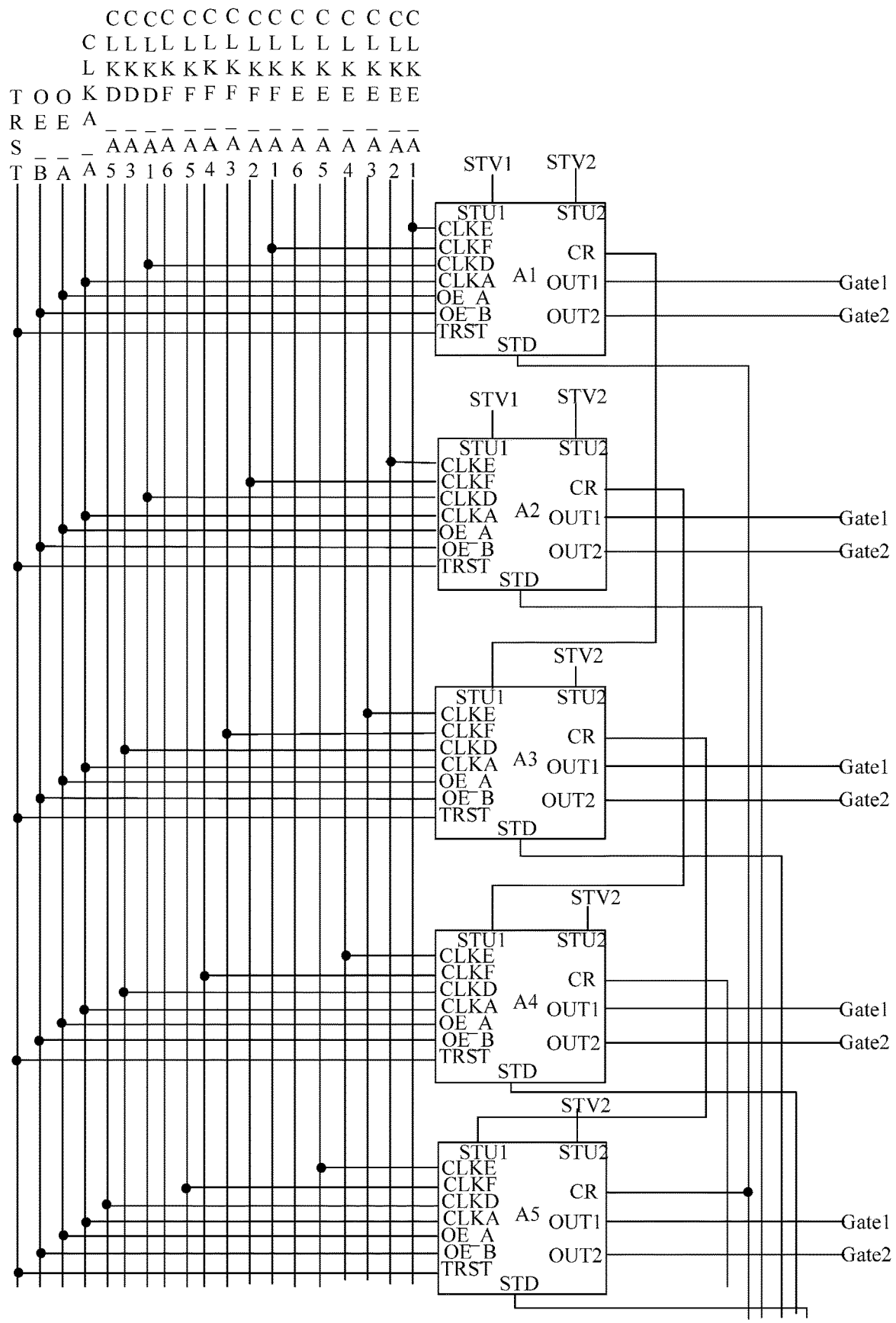
FIG. 17 is a first schematic structural diagram of a gate drive circuit according to an embodiment of the present disclosure.
Figure 18:
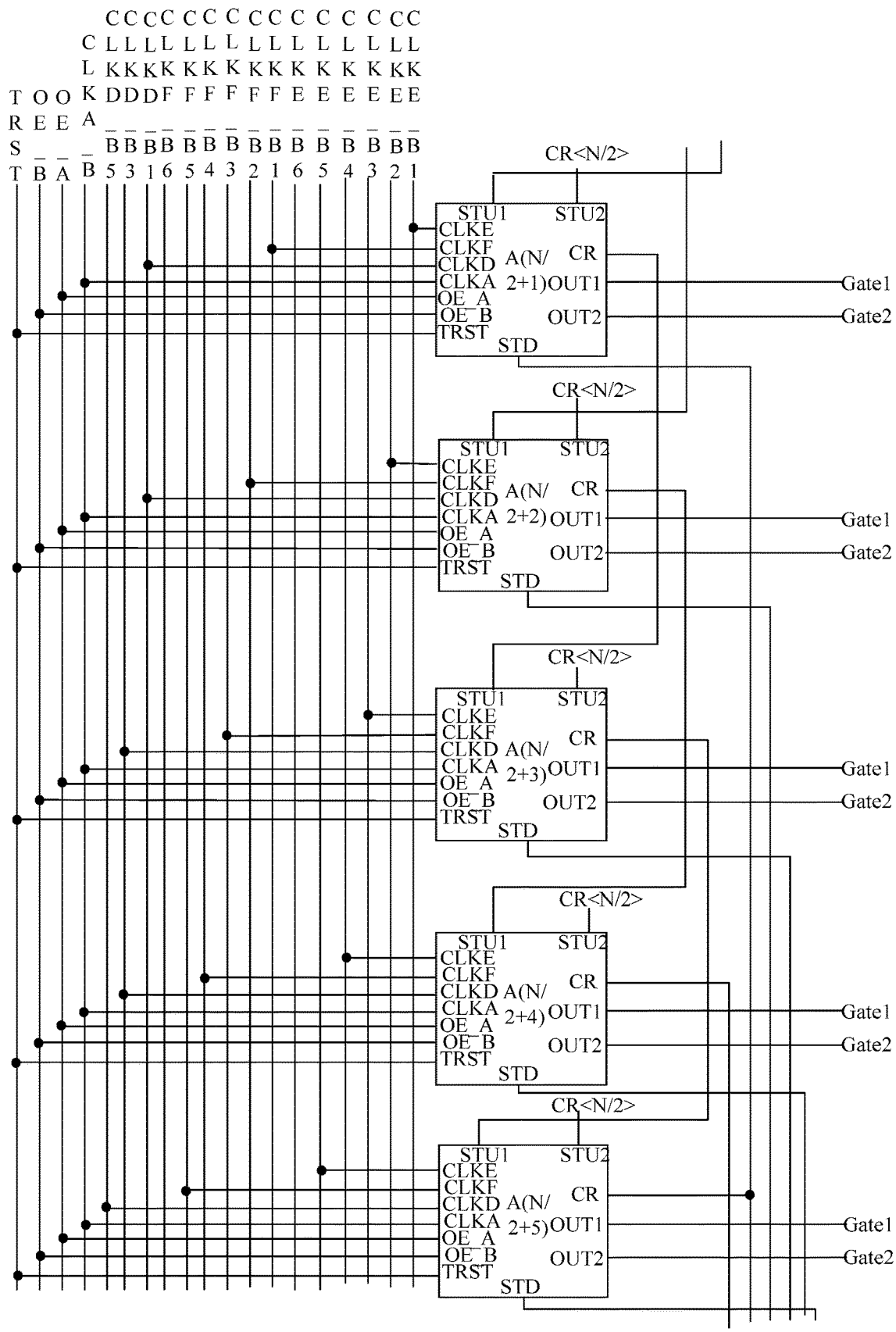
FIG. 18 is a second schematic structural diagram of a gate drive circuit according to an embodiment of the present disclosure.

As shown in FIG. 17 and FIG. 18, some embodiments of the present disclosure further provide a gate drive circuit, which includes multiple cascaded shift registers. Schematic diagrams of some shift registers are exemplarily given in FIG. 17 and FIG. 18, the shift registers may be the shift registers provided in the previous embodiments, and their implementation principles and effects are similar, which will not be repeated here.

In the gate drive circuit, a port of each stage of shift register may include a first power supply terminal VDD, a second power supply terminal VGL1, a third power supply terminal VGL2, a first clock signal terminal CLKA, a second clock signal terminal CLKD, one or more driving clock signal terminals CLKX (for example, CLKX may be CLKE or CLKF), a cascade output terminal CR, and one or more signal output terminals OUTX (for example, CLKX may be OUT1 or OUT2), a first signal input terminal STU1, a second signal input terminal STU2, a reset signal terminal STD, a total reset terminal TRST, a first random signal terminal OE_A and a second random signal terminal OE_B.

In this embodiment, the first random signal terminal OE_A of each stage of shift register is connected with the first random signal line OE_A, the second random signal terminal OE_B of each stage of shift register is connected with the second random signal line OE_B, and the total reset terminal TRST of each stage of shift register is connected with a total reset signal line TRST.

The first signal input terminals STU1 of the shift registers located at the first and second stages are connected with a frame start signal input terminal STV1, the first signal input terminal STU1 of the shift register located at the i-th stage is connected with the cascade output terminal Cr<i−2> of the shift register located at the (i−2)th stage, where 3≤i≤N and N is a total quantity of stages of the shift registers.

The second signal input terminals STU2 of the shift registers located at the first to sixth stages are connected with a black frame insertion start signal input terminal STV2, and the second signal input terminals STU2 of the shift registers located at the (6m+1)-th to (6m+6)-th stages are connected with the cascade output terminal CR<6m> of the shift register located at the (6m)-th stage, wherein m is a positive integer.

In some possible implementations, the black frame insertion may be also performed simultaneously on any quantity of rows of sub-pixel units as a group except the 6 rows. The embodiment of the present disclosure describes a cascade mode of each stage of shift register in the gate drive circuit by taking 6 rows of sub-pixel units as a group on which black frame insertion simultaneously are performed as an example. When the black frame insertion is performed simultaneously on any quantity of rows of sub-pixel units as a group except the 6 rows, the cascade mode of the shift register may be obtained by analogy according to the cascade mode of the shift registers of the embodiment of the present disclosure. That is, the present disclosure does not limit the quantity of rows of sub-pixel units on which the black frame insertion is performed simultaneously, and it is within the scope of protection of the present disclosure that the black frame insertion is performed simultaneously on any quantity of rows of sub-pixel units as a group.

The reset signal terminals STD of the shift registers located at the (N−4)-th to N-th stages are connected with a reset signal line (the reset signal line here may be the total reset signal line or a reset signal line provided independently from the total reset signal line), and the reset signal terminal STD of the shift register located at the k-th stage is connected with the cascade output terminal Cr<k+4> of the shift register located at the (k+4)-th stage, with 1≤k≤N−4.

The first clock signal terminals CLKA of the shift registers located at the first to (N/2)-th stages are connected with a first clock signal line CLKA_A, and the first clock signal terminals CLKA of the shift registers located at the (N/2+1)-th to N-th stages are connected with a second clock signal line CLKA_B.

The second clock signal terminals CLKD of the shift registers located at the (6a+1)-th and (6a+2)-th stages are connected with a third clock signal line CLKD_A1. The second clock signal terminals CLKD of the shift registers located at the (6a+3)-th and (6a+4)-th stages are connected with a fourth clock signal line CLKD_A3. The second clock signal terminals CLKD of the shift registers located at the (6a+5)-th and (6a+6)-th stages are connected with a fifth clock signal line CLKD_A5. The second clock signal terminals CLKD of the shift registers located at the (6b+1)-th and (6b+2)-th stages are connected with a sixth clock signal line CLKD_B1. The second clock signal terminals CLKD of the shift registers located at the (6b+3)-th and (6b+4)-th stages are connected with a seventh clock signal line CLKD_B3. The second clock signal terminals CLKD of the shift registers located at the (6th+5)-th and (6th+6)-th stages are connected with an eighth clock signal line CLKD_B5, wherein 6a+6≤N/2, a is an integer greater than or equal to 0, and 6b≥N/2, b is a positive integer.

The driving clock signal terminal CLKX of the shift register located at the (6a+1)-th stage is connected with a ninth clock signal line CLKX_A1. The driving clock signal terminal CLKX of the shift register located at the (6a+2)-th stage is connected with a tenth clock signal line CLKX_A2. The driving clock signal terminal CLKX of the shift register located at the (6a+3)-th stage is connected with an eleventh clock signal line CLKX_A3. The driving clock signal terminal CLKX of the shift register located at the (6a+4)-th stage is connected with a twelfth clock signal line CLKX_A4. The driving clock signal terminal CLKX of the shift register located at the (6a+5)-th stage is connected with a thirteenth clock signal line CLKX_A5. The driving clock signal terminal CLKX of the shift register located at the (6a+6)-th stage is connected with a fourteenth clock signal line CLKX_A6. The driving clock signal terminal CLKX of the shift register located at the (6b+1)-th stage is connected with a 15-th clock signal line CLKX_B1. The driving clock signal terminal CLKX of the shift register located at the (6b+2)-th stage is connected with a sixteenth clock signal line CLKX_B2. The driving clock signal terminal CLKX of the shift register located at the (6b+3)-th stage is connected with a seventeenth clock signal line CLKX_B3. The driving clock signal terminal CLKX of the shift register located at the (6b+4)-th stage is connected with an eighteenth clock signal line CLKX_B4. The driving clock signal terminal CLKX of the shift register located at the (6b+5)-th stage is connected with a nineteenth clock signal line CLKX_B5. The driving clock signal terminal CLKX of the shift register located at the (6b+6)-th stage is connected with a twentieth clock signal line CLKX_B6, wherein 6a+6≤N/2, a is an integer greater than or equal to 0, and 6b≥N/2, b is a positive integer.

In an exemplary embodiment, each stage of shift register includes two driving clock signal terminals CLKE and CLKF, then correspondingly, the ninth clock signal line CLKX_A1 includes CLKE_A1 and CLKF_A1 respectively corresponding to the two driving clock signal terminals CLKE and CLKF. The tenth clock signal line CLKX_A2 includes CLKE_A2 and CLKF_A2 respectively corresponding to the two driving clock signal terminals CLKE and CLKF, . . . , and the twentieth clock signal line CLKX_B6 includes CLKE_B6 and CLKF_B6 respectively corresponding to the two driving clock signal terminals CLKE and CLKF.

Figure 19:
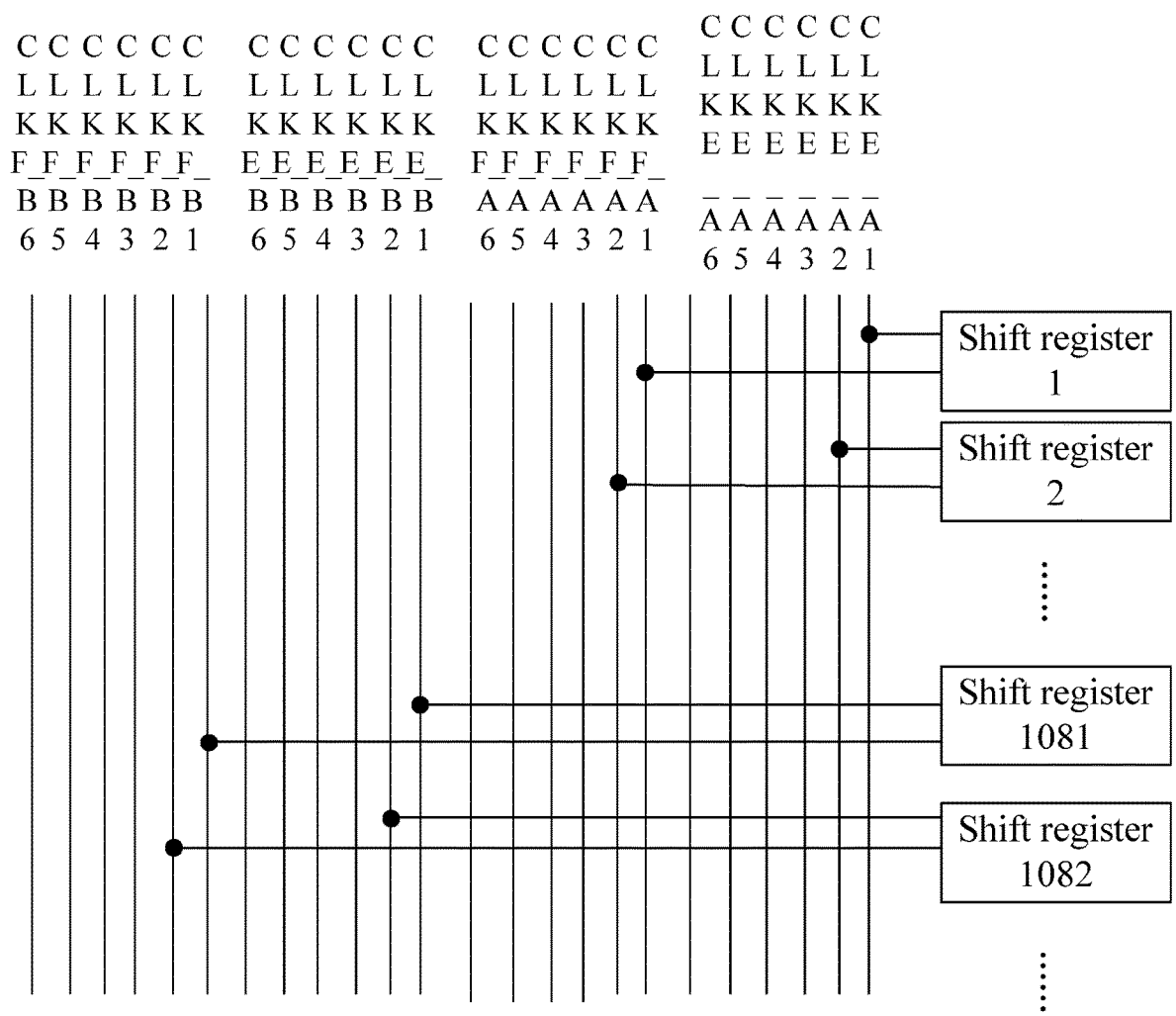
FIG. 19 is a third schematic structural diagram of a gate drive circuit according to an embodiment of the present disclosure.
Figure 20:
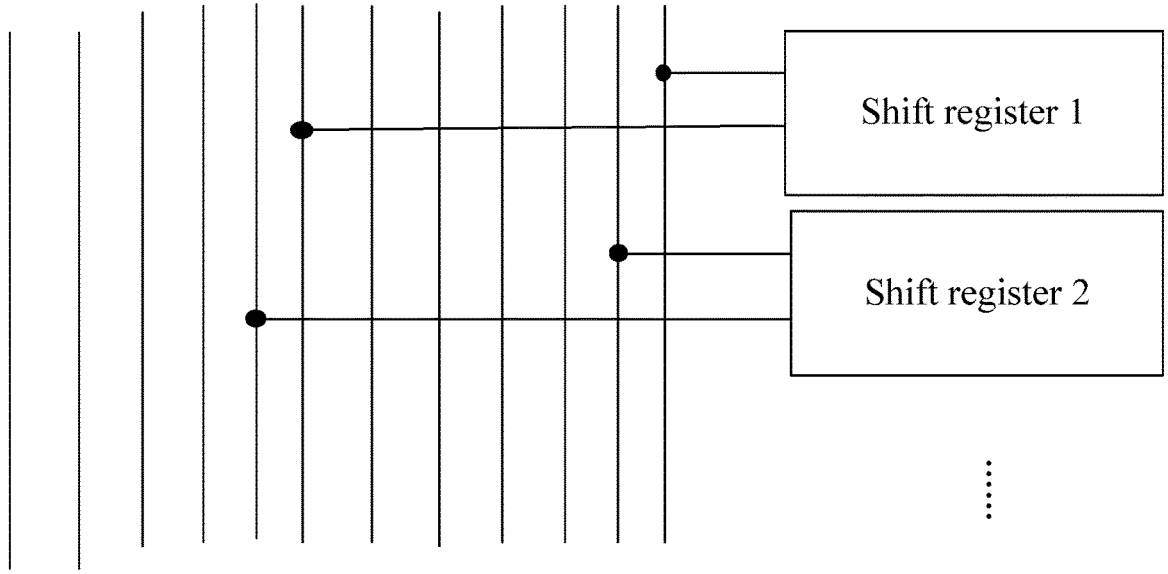
FIG. 20 is a fourth schematic structural diagram of a gate drive circuit according to an embodiment of the present disclosure.
Figure 20:
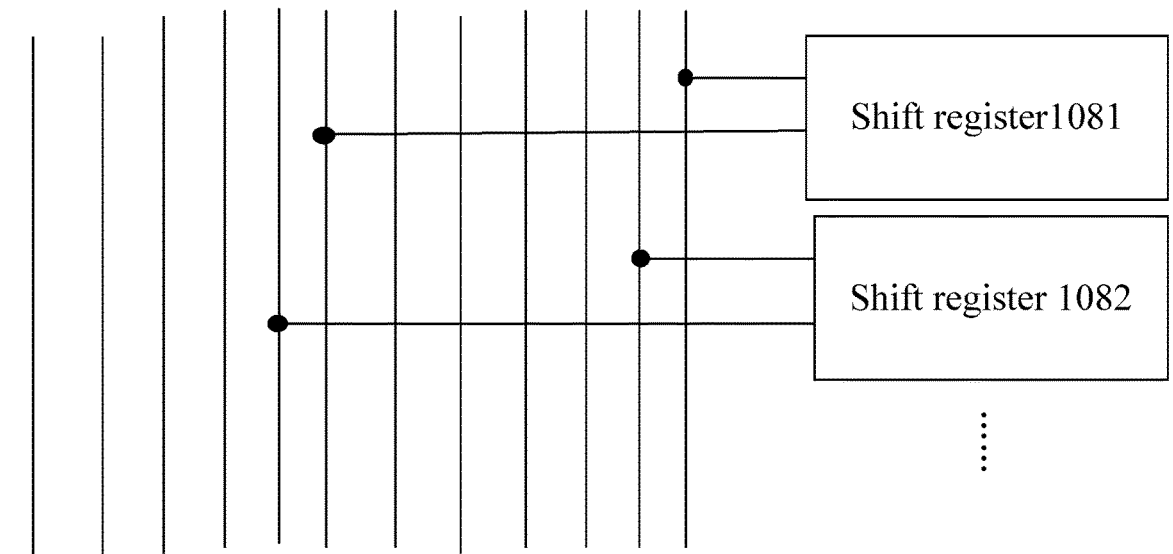

As shown in FIG. 19, each clock signal line may be arranged in sequence from a direction away from the shift register to a direction close to the shift register, or, as shown in FIG. 20, each clock signal line may be divided into two groups, wherein one group of shift registers are arranged in sequence at a side from the first stage of shift register to the (N/2)-th stage of shift register from a position away from the shift registers to a position close to the shift registers and the other group of shift registers are arranged in sequence at a side from the (N/2+1)-th stage of shift register to the N-th stage of shift register from a position away from the shift registers to a position close to the shift registers.

In an exemplary embodiment, when each stage of shift register includes three or more driving clock signal terminals, the ninth to twentieth clock signal lines respectively include three or more clock signal lines corresponding to the driving clock signal terminals one-to-one.

In the gate drive circuit of the embodiment of the present disclosure, the clock signal lines connected with the driving clock signal terminals of the shift registers in the upper and lower half-screens are divided into two groups, other signals of the shift registers in the upper and lower half-screens are shared, the black frame insertion is performed on the lower half-screen during a clock gap of writing data into the upper half-screen, and black frame insertion is performed on the upper half-screen during a clock gap of writing data into the lower half-screen, thus greatly reducing the refresh frequency required by the black frame insertion, and ensuring the high refresh frequency of the display panel while enhancing the MPRT of the display panel.

Some embodiments of the present disclosure further provide a method for driving a gate drive circuit, which is applied to the gate drive circuit provided by the previous embodiments, and the gate drive circuit includes multiple cascaded shift registers as described above. The method for driving the gate drive circuit includes the following:

During display of one frame, for a from 0 to (N/12−1), the following acts are executed in sequence: after the (6a+1)-th to (6a+6)-th stages of shift registers are caused to be in the display driving phase, the (N/2+6a+1)-th to (N/2+6a+6)-th stages of shift registers are caused to be in the black frame insertion phase simultaneously; 6a+6≤N/2, a is an integer greater than or equal to 0, and N is a total quantity of stages of shift registers.

For b from N/12 to (N/6−1), after the (6b+1)-th to (6b+6)-th stages of shift registers are caused to be in the display driving phase, the (6b+1−N/2)-th to (6b+6−N/2)-th stages of shift registers are caused to be in the black frame insertion phase simultaneously; 6b≥N/2, b is an positive integer.

In an exemplary embodiment, during display of one frame, the method for driving the gate drive circuit includes the following:

When a=0, 6a+1=1, 6a+6=6, N/2+6a+1=N/2+1, N/2+6a+6=N/2+6, even after the 1st to 6th stages of shift registers are in the display driving phase, the (N/2+1)-th to (N/2+1)-th stages shift registers are caused to be in the black frame insertion phase simultaneously.

When a=1, 6a+1=7, 6a+6=12, N/2+6a+1=N/2+7, N/2+6a+6=N/2+12, even after the 7th to 12th stages of shift registers are in the display driving phase, the (N/2+7)-th to (N/2+12)-th stages of shift registers are caused to be in the black frame insertion phase simultaneously.

When a=N/12−2, 6a+1=N/2−11, 6a+6=N/2−6, N/2+6a+1=N−11, N/2+6a+6=N−6, even after the (N/2−11)-th to (N/2−6)-th stages of shift registers are in the display driving phase, the (N−11)-th to (N−6)-th stages of shift registers are caused to be in the black frame insertion phase simultaneously.

When a=N/12−1, 6a+1=N/2−5, 6a+6=N/2, N/2+6a+1=N−5, N/2+6a+6=N, even after the (N/2−5)-th to (N/2)-th stages of shift registers are in the display driving phase, the (N−5)-th to N-th stages of shift registers are caused to be in the black frame insertion phase simultaneously.

At this time, the display driving phase of the upper half-screen ends, and the black frame insertion phase of the lower half-screen ends.

When b=N/12, 6b+1=N/2+1, 6b+6=N/2+6, 6b+1−N/2=1, 6b+6−N/2=6, even after the (N/2+1)-th to (N/2+6)-th stages of shift registers are in the display driving phase, the 1st to 6th stages of shift registers are caused to be in the black frame insertion phase simultaneously.

When b=N/12+1, 6b+1=N/2+7, 6b+6=N/2+12, 6b+1−N/2=7, 6b+6−N/2=12, even after the (N/2+7)-th to (N/2+12)-th stages of shift registers are in the display driving phase, the 7th to 12th stages of shift registers are caused to be in the black frame insertion phase simultaneously.

When b=N/6−2, 6b+1=N−11, 6b+6=N−6, 6b+1−N/2=N/2−11, 6b+6−N/2=N/2−6, even after the (N−11)-th to (N−6)-th stages of shift registers are in the display driving phase, the (N/2−11)-th to (N/2−6)-th stages of shift registers are caused to be in the black frame insertion phase simultaneously.

When b=N/6−1, 6b+1=N−5, 6b+6=N, 6b+1−N/2=N/2−5, 6b+6−N/2=N/2, even after the (N−5)-th to N-th stages of shift registers are in the display driving phase, the (N/2−5)-th to (N/2)-th stages of shift registers are caused to be in the black frame insertion phase simultaneously.

That is, the display driving phase of the lower half-screen ends, and the black frame insertion phase of the upper half-screen ends, and that is, the display phase of one frame ends.

In some possible implementations, the black frame insertion may be also performed simultaneously on any quantity of rows of sub-pixel units as a group except the 6 rows. The present disclosure does not limit a quantity of rows of sub-pixel units on which the black frame insertion is performed simultaneously, and it is within the scope of protection of the present disclosure that the black frame insertion is performed simultaneously on any quantity of rows of sub-pixel units as a group.

In an exemplary embodiment, during display of one frame, the method further includes: one stage of shift register of the first to N-th stages of shift registers is randomly caused to be in the sensing phase.

According to the method for driving the gate drive circuit of the embodiment of the present disclosure, the black frame insertion is performed on the lower half-screen during a clock gap of writing data into the upper half-screen and the black frame insertion is performed on the upper half-screen during a clock gap of writing data into the lower half-screen, thus greatly reducing the refresh frequency required by the black frame insertion, and ensuring the high refresh frequency of the display panel while enhancing the MPRT of the display panel.

The following points need to be noted.

The drawings of the embodiments of the present disclosure only involve structures involved in the embodiments of the present disclosure, and the other structures may refer to conventional designs.

The embodiments in the present disclosure, i.e., the features in the embodiments, may be combined without conflicts to obtain new embodiments.

Although the embodiments disclosed in the present disclosure are as above, the described contents are only embodiments used for convenience of understanding the present disclosure and are not intended to limit the present disclosure. Any one skilled in the art to which the present disclosure pertains can make any modifications and variations in implementation manners and details without departing from the spirit and scope of the present disclosure. However, the protection scope of the present disclosure should be subject to the scope defined by the appended claims.

The invention claimed is:

1. A shift register, comprising: a display pre-charge reset sub-circuit, a sensing pre-charge reset sub-circuit, a pull-down control sub-circuit, an output sub-circuit, a sensing cascade sub-circuit and a black frame insertion cascade sub-circuit, wherein:
the display pre-charge reset sub-circuit is configured to provide a signal of a first power supply terminal to a pull-up node under control of a first signal input terminal, and provide a signal of a second power supply terminal to the pull-up node under control of a reset signal terminal;
the sensing pre-charge reset sub-circuit is configured to provide a signal of a first clock signal terminal to the pull-up node under control of a sensing cascade node and the first clock signal terminal, and provide a signal of the second power supply terminal to the pull-up node under control of a total reset terminal;
the pull-down control sub-circuit is configured to provide the signal of the first power supply terminal or the second power supply terminal to a pull-down node under control of the pull-up node;
the output sub-circuit is configured to provide a signal of a second clock signal terminal to a cascade output terminal and provide signals of corresponding driving clock signal terminals to one or more signal output terminals under the control of the pull-up node, and provide the signal of the second power supply terminal to the cascade output terminal and provide a signal of a reset power supply terminal to the one or more signal output terminals under the control of the pull-down node;
the sensing cascade sub-circuit is configured to provide a signal of the first signal input terminal to the sensing cascade node under control of a first random signal terminal; and
the black frame insertion cascade sub-circuit is configured to provide a signal of a second signal input terminal to the sensing cascade node under control of a second random signal terminal.

2. The shift register according to claim 1, wherein the black frame insertion cascade sub-circuit comprises: a first transistor;
a control electrode of the first transistor is connected with the second random signal terminal, a first electrode of the first transistor is connected with the second signal input terminal, and a second electrode of the first transistor is connected with the sensing cascade node.

3. The shift register according to claim 1, wherein the sensing cascade sub-circuit comprises: a second transistor;
a control electrode of the second transistor is connected with the first random signal terminal, a first electrode of the second transistor is connected with the first signal input terminal, and a second electrode of the second transistor is connected with the sensing cascade node.

4. The shift register according to claim 1, wherein the sensing pre-charge reset sub-circuit comprises: a third transistor, a fourth transistor, and a fifth transistor;
a control electrode of the third transistor is connected with the sensing cascade node, a first electrode of the third transistor is connected with the first clock signal terminal, and a second electrode of the third transistor is connected with a sensing pre-charge node;
a control electrode of the fourth transistor is connected with the first clock signal terminal, a first electrode of the fourth transistor is connected with the sensing pre-charge node, and a second electrode of the fourth transistor is connected with the pull-up node; and
a control electrode of the fifth transistor is connected with the total reset terminal, a first electrode of the fifth transistor is connected with the pull-up node, and a second electrode of the fifth transistor is connected with the second power supply terminal.

5. The shift register according to claim 1, wherein the display pre-charge reset sub-circuit comprises: a sixth transistor and a seventh transistor;
a control electrode of the sixth transistor is connected with the first signal input terminal, a first electrode of the sixth transistor is connected with the first power supply terminal, and a second electrode of the sixth transistor is connected with the pull-up node; and
a control electrode of the seventh transistor is connected with the reset signal terminal, a first electrode of the seventh transistor is connected with the pull-up node, and a second electrode of the seventh transistor is connected with the second power supply terminal.

6. The shift register according to claim 1, wherein the pull-down control sub-circuit comprises: an eighth transistor and a ninth transistor;
a control electrode and a first electrode of the eighth transistor are both connected with the first power supply terminal, and a second electrode of the eighth transistor is connected with the pull-down node;
a control electrode of the ninth transistor is connected with the pull-up node, a first electrode of the ninth transistor is connected with the pull-down node, and a second electrode of the ninth transistor is connected with the second power supply terminal.

7. The shift register according to claim 1, wherein the output sub-circuit comprises: a tenth transistor, an eleventh transistor, a twelfth transistor, a thirteenth transistor, a fourteenth transistor and a fifteenth transistor;
a control electrode of the tenth transistor is connected with the pull-up node, a first electrode of the tenth transistor is connected with the second clock signal terminal, and a second electrode of the tenth transistor is connected with the cascade output terminal;
a control electrode of the eleventh transistor is connected with the pull-down node, a first electrode of the eleventh transistor is connected with the cascade output terminal, and a second electrode of the eleventh transistor is connected with the second power supply terminal;
a control electrode of the twelfth transistor is connected with the pull-up node, a first electrode of the twelfth transistor is connected with a first driving clock signal terminal, and a second electrode of the twelfth transistor is connected with a first signal output terminal;
a control electrode of the thirteenth transistor is connected with the pull-down node, a first electrode of the thirteenth transistor is connected with the first signal output terminal, and a second electrode of the thirteenth transistor is connected with the reset power supply terminal;

a control electrode of the fourteenth transistor is connected with the pull-up node, a first electrode of the fourteenth transistor is connected with a second driving clock signal terminal, and a second electrode of the fourteenth transistor is connected with a second signal output terminal; and a control electrode of the fifteenth transistor is connected with the pull-down node, a first electrode of the fifteenth transistor is connected with the second signal output terminal, and a second electrode of the fifteenth transistor is connected with the reset power supply terminal.

8. The shift register according to claim 7, wherein the first signal output terminal is connected with a first gate line in a pixel circuit, and the second signal output terminal is connected with a second gate line in the pixel circuit.

9. The shift register according to claim 1, further comprising: a noise reduction sub-circuit;

the noise reduction sub-circuit is configured to provide the signal of the second power supply terminal to the pull-up node under the control of the pull-down node.

10. The shift register according to claim 9, wherein the noise reduction sub-circuit comprises: a sixteenth transistor;

a control electrode of the sixteenth transistor is connected with the pull-down node, a first electrode of the sixteenth transistor is connected with the pull-up node, and a second electrode of the sixteenth transistor is connected with the second power supply terminal.

11. The shift register according to claim 1, further comprising: a noise reduction sub-circuit;

the black frame insertion cascade sub-circuit comprises: a first transistor; the sensing cascade sub-circuit comprises a second transistor; the sensing pre-charge reset sub-circuit comprises a third transistor, a fourth transistor and a fifth transistor; the display pre-charge reset sub-circuit comprises a sixth transistor and a seventh transistor; the pull-down control sub-circuit comprises an eighth transistor and a ninth transistor; the output sub-circuit comprises a tenth transistor, an eleventh transistor, a twelfth transistor, a thirteenth transistor, a fourteenth transistor and a fifteenth transistor; and the noise reduction sub-circuit comprises a sixteenth transistor;

a control electrode of the first transistor is connected with the second random signal terminal, a first electrode of the first transistor is connected with the second signal input terminal, and a second electrode of the first transistor is connected with the sensing cascade node;

a control electrode of the second transistor is connected with the first random signal terminal, a first electrode of the second transistor is connected with the first signal input terminal, and a second electrode of the second transistor is connected with the sensing cascade node;

a control electrode of the third transistor is connected with the sensing cascade node, a first electrode of the third transistor is connected with the first clock signal terminal, and a second electrode of the third transistor is connected with a sensing pre-charge node;

a control electrode of the fourth transistor is connected with the first clock signal terminal, a first electrode of the fourth transistor is connected with the sensing pre-charge node, and a second electrode of the fourth transistor is connected with the pull-up node;

a control electrode of the fifth transistor is connected with the total reset terminal, a first electrode of the fifth transistor is connected with the pull-up node, and a second electrode of the fifth transistor is connected with the second power supply terminal;

a control electrode of the sixth transistor is connected with the first signal input terminal, a first electrode of the sixth transistor is connected with the first power supply terminal, and a second electrode of the sixth transistor is connected with the pull-up node;

a control electrode of the seventh transistor is connected with the reset signal terminal, a first electrode of the seventh transistor is connected with the pull-up node, and a second electrode of the seventh transistor is connected with the second power supply terminal;

a control electrode and a first electrode of the eighth transistor are both connected with the first power supply terminal, and a second electrode of the eighth transistor is connected with the pull-down node;

a control electrode of the ninth transistor is connected with the pull-up node, a first electrode of the ninth transistor is connected with the pull-down node, and a second electrode of the ninth transistor is connected with the second power supply terminal;

a control electrode of the tenth transistor is connected with the pull-up node, a first electrode of the tenth transistor is connected with the second clock signal terminal, and a second electrode of the tenth transistor is connected with the cascade output terminal;

a control electrode of the eleventh transistor is connected with the pull-down node, a first electrode of the eleventh transistor is connected with the cascade output terminal, and a second electrode of the eleventh transistor is connected with the second power supply terminal;

a control electrode of the twelfth transistor is connected with the pull-up node, a first electrode of the twelfth transistor is connected with the first driving clock signal terminal, and a second electrode of the twelfth transistor is connected with a first signal output terminal;

a control electrode of the thirteenth transistor is connected with the pull-down node, a first electrode of the thirteenth transistor is connected with the first signal output terminal, and a second electrode of the thirteenth transistor is connected with the reset power supply terminal;

a control electrode of the fourteenth transistor is connected with the pull-up node, a first electrode of the fourteenth transistor is connected with the second driving clock signal terminal, and a second electrode of the fourteenth transistor is connected with a second signal output terminal;

the control electrode of the fifteenth transistor is connected with the pull-down node, a first electrode of the fifteenth transistor is connected with the second signal output terminal, and a second electrode of the fifteenth transistor is connected with the reset power supply terminal; and a control electrode of the sixteenth transistor is connected with the pull-down node, a first electrode of the sixteenth transistor is connected with the pull-up node, and a second electrode of the sixteenth transistor is connected with the second power supply terminal.

12. A gate drive circuit, comprising a plurality of cascaded shift registers according to claim 1;

a driving clock signal terminal of a shift register located at a (6a+1)-th stage is connected with a ninth clock signal line, a driving clock signal terminal of a shift register located at a (6a+2)-th stage is connected with a tenth clock signal line, a driving clock signal terminal of a shift register located at a (6a+3)-th stage is connected with an eleventh clock signal line, a driving clock signal terminal of a shift register located at a (6a+4)-th stage is connected with a twelfth clock signal line, a driving clock signal terminal of a shift register located at a (6a+5)-th stage is connected with a thirteenth clock signal line, a driving clock signal terminal of a shift register located at a (6a+6)-th stage is connected with a fourteenth clock signal line, a driving clock signal terminal of a shift register located at a (6b+1)-th stage is connected with a fifteenth clock signal line, a driving clock signal terminal of a shift register located at a (6b+2)-th stage is connected with a sixteenth clock signal line, a driving clock signal terminal of a shift register located at a (6b+3)-th stage is connected with a seventeenth clock signal line, a driving clock signal terminal of a shift register located at a (6b+4)-th stage is connected with an eighteenth clock signal line, a driving clock signal terminal of a shift register located at a (6b+5)-th stage is connected with a nineteenth clock signal line, and a driving clock signal terminal of a shift register located at a (6b+6)-th stage is connected with a twentieth clock signal line, wherein 6a+6≤N/2, a is an integer greater than or equal to 0, and 6b_N/2, b is a positive integer.

13. The gate drive circuit according to claim 12, wherein first clock signal terminals of shift registers located at first to (N/2)-th stages are connected with a first clock signal line, and first clock signal terminals of shift registers located at (N/2+1)-th to N-th stages are connected with a second clock signal line; and second clock signal terminals of the shift registers located at (6a+1)-th and (6a+2)-th stages are connected with a third clock signal line, second clock signal terminals of the shift registers located at (6a+3)-th to (6a+4)-th stages are connected with a fourth clock signal line, second clock signal terminals of the shift registers located at (6a+5)-th to (6a+6)-th stages are connected with a fifth clock signal line, second clock signal terminals of the shift registers located at (6b+1)-th to (6b+2)-th stages are connected with a sixth clock signal line, second clock signal terminals of the shift registers located at (6b+3)-th to (6b+4)-th stages are connected with a seventh clock signal line, and second clock signal terminals of the shift registers located at (6b+5)-th to (6b+6)-th stages are connected with an eighth clock signal line.

14. A method for driving a gate drive circuit, applied to the gate drive circuit according to claim 12, wherein during display of one frame, the method comprises:

for a from 0 to (N/12−1), following acts are executed in sequence: after (6a+1)-th to (6a+6)-th stages of shift registers are caused to be in a display driving phase, (N/2+6a+1)-th to (N/2+6a+6)-th stages of shift registers are caused to be in a black frame insertion phase simultaneously; wherein a is an integer greater than or equal to 0 and N is a total quantity of stages of the shift registers; and for b from N/12 to (N/6−1), following acts are executed in sequence: after (6b+1)-th to (6b+6)-th stages of shift registers are caused to be in the display driving phase, (6b+1-N/2)-th to (6b+6-N/2)-th stages of shift registers are caused to be in the black frame insertion phase simultaneously; wherein b is an positive integer.

15. The method according to claim 14, wherein the method further comprises, during the display of one frame: one stage shift register of first to N-th stage of shift registers is randomly caused to be in a sensing phase.

16. The gate drive circuit according to claim 12,
wherein first signal input terminals of shift registers located at first and second stages are connected with a frame start signal input terminal, a first signal input terminal of a shift register located at an i-th stage is connected with a cascade output terminal of a shift register located at a (i-2)-th stage, wherein 3≤i≤N, and N is a total quantity of stages of the shift registers.

17. The gate drive circuit according to claim 16,
wherein second signal input terminals of shift registers located at first to sixth stages are connected with a black frame insertion start signal input terminal, and second signal input terminals of shift registers located at (6m+1)-th to (6m+6)-th stages are connected with a cascade output terminal of a shift register located at a (6m)-th stage, wherein m is a positive integer.

18. The gate drive circuit according to claim 17,
wherein reset signal terminals of shift registers located at (N-4)-th to N-th stages are connected with a reset signal line, and a reset signal terminal of a shift register located at a k-th stage is connected with a cascade output terminal of a shift register located at a (k+4)-th stage, wherein 1≤k≤N−4.

19. The gate drive circuit according to claim 16, wherein first clock signal terminals of shift registers located at first to (N/2)-th stages are connected with a first clock signal line, and first clock signal terminals of shift registers located at (N/2+1)-th to N-th stages are connected with a second clock signal line; and second clock signal terminals of the shift registers located at (6a+1)-th and (6a+2)-th stages are connected with a third clock signal line, second clock signal terminals of the shift registers located at (6a+3)-th to (6a+4)-th stages are connected with a fourth clock signal line, second clock signal terminals of the shift registers located at (6a+5)-th to (6a+6)-th stages are connected with a fifth clock signal line, second clock signal terminals of the shift registers located at (6b+1)-th to (6b+2)-th stages are connected with a sixth clock signal line, second clock signal terminals of the shift registers located at (6b+3)-th to (6b+4)-th stages are connected with a seventh clock signal line, and second clock signal terminals of the shift registers located at (6b+5)-th to (6b+6)-th stages are connected with an eighth clock signal line.

20. A method for driving a shift register, applied to the shift register according to claim 1, the method comprises a display driving phase, a sensing phase and a black frame insertion phase, wherein:

in the display driving phase, the display pre-charge reset sub-circuit provides the signal of the first power supply terminal to the pull-up node under the control of the first signal input terminal; the pull-down control sub-circuit provides the signal of the first power supply terminal to the pull-down node under the control of the pull-up node; the output sub-circuit provides the signal of the reset power supply terminal to one or more signal output terminals under the control of the pull-down node; the output sub-circuit provides the signals of the corresponding driving clock signal terminals to the one or more signal output terminals under the control of the pull-up node; the display pre-charge reset sub-circuit provides the signal of the second power supply terminal to the pull-up node under the control of the reset signal terminal; the pull-down control sub-circuit provides the signal of the first power supply terminal to the pull-down node under the control of the pull-up node;

in the sensing phase, the sensing cascade sub-circuit provides the signal of the first signal input terminal to the sensing cascade node under the control of the first random signal terminal; the sensing pre-charge reset sub-circuit provides the signal of the first clock signal terminal to the pull-up node under the control of the sensing cascade node and the first clock signal terminal; the output sub-circuit provides the signals of the corresponding driving clock signal terminals to the one or more signal output terminals under the control of the pull-up node, the sensing pre-charge reset sub-circuit provides the signal of the second power supply terminal to the pull-up node under the control of the total reset terminal; and in the black frame insertion phase, the black frame insertion cascade sub-circuit provides the signal of the second signal input terminal to the sensing cascade node under the control of the second random signal terminal; the sensing pre-charge reset sub-circuit provides the signal of the first clock signal terminal to the pull-up node under the control of the sensing cascade node and the first clock signal terminal; the output sub-circuit provides the signals of the corresponding driving clock signal terminals to the one or more signal output terminals under the control of the pull-up node, the sensing pre-charge reset sub-circuit provides the signal of the second power supply terminal to the pull-up node under the control of the total reset terminal.

\* \* \* \* \*